(12) United States Patent
Wang et al.

(10) Patent No.: US 12,513,833 B2
(45) Date of Patent: Dec. 30, 2025

(54) DISPLAY MODULE, MANUFACTURE METHOD THEREFOR AND ELECTRIC DEVICE COMPRISING THE SAME

(71) Applicants: BEIJING BOE DISPLAY TECHNOLOGY CO., LTD., Beijing (CN); BOE TECHNOLOGY GROUP CO., LTD., Beijing (CN)

(72) Inventors: Xinrui Wang, Beijing (CN); Guojian Qu, Beijing (CN); Haijun Shi, Beijing (CN); Zhuang Xu, Beijing (CN); Beibei Wang, Beijing (CN)

(73) Assignees: Beijing BOE Display Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 488 days.

(21) Appl. No.: 18/042,455

(22) PCT Filed: May 24, 2022

(86) PCT No.: PCT/CN2022/094650
§ 371 (c)(1),
(2) Date: Feb. 21, 2023

(87) PCT Pub. No.: WO2023/225839
PCT Pub. Date: Nov. 30, 2023

(65) Prior Publication Data
US 2024/0292550 A1     Aug. 29, 2024

(51) Int. Cl.
*H05K 5/02*     (2006.01)
*H05K 1/14*     (2006.01)
(Continued)

(52) U.S. Cl.
CPC ........... *H05K 5/0217* (2013.01); *H05K 1/147* (2013.01); *H05K 1/189* (2013.01); *H05K 5/03* (2013.01);
(Continued)

(58) Field of Classification Search
CPC ........ H05K 5/0217; H05K 5/03; H05K 1/147; H05K 1/189
(Continued)

(56) References Cited

U.S. PATENT DOCUMENTS

| 2008/0238273 | A1  | 10/2008 | Lee et al. |
| 2010/0073591 | A1* | 3/2010  | Choi ............... H05K 1/147 349/58 |

(Continued)

FOREIGN PATENT DOCUMENTS

| CN | 101277414 A | 10/2008 |
| CN | 103792706 A | 5/2014 |

(Continued)

OTHER PUBLICATIONS

International Search Report and Written Opinion dated Dec. 15, 2022, for corresponding PCT Application No. PCT/CN2022/094650.

*Primary Examiner* — Andargie M Aychillhum
(74) *Attorney, Agent, or Firm* — Kinney & Lange, P.A.

(57) ABSTRACT

The present disclosure provides a display module having: a supporting intermediate frame and a transparent cover plate, wherein the supporting intermediate frame comprises a main plate portion extending in a direction the same as the transparent cover plate and a supporting lateral edge disposed to surround the main plate portion, and the supporting intermediate frame and the transparent cover plate form a first accommodation space; a display unit disposed in the first accommodation space; and a control board disposed at (Continued)

a side of the main plate portion away from the display unit, wherein the control board is electrically connected to the display unit to transmit a display signal to the display unit; wherein the supporting intermediate frame further has at least one fixing portion disposed at a side of the main plate portion away from the display unit for fixing the control board. The present disclosure also provides a method for manufacturing the display module and an electric device comprising the display module.

20 Claims, 12 Drawing Sheets

(51) Int. Cl.
*H05K 1/18* (2006.01)
*H05K 5/03* (2006.01)
(52) U.S. Cl.
CPC .............. *H05K 2201/09063* (2013.01); *H05K 2201/10128* (2013.01); *H05K 2201/10189* (2013.01)
(58) Field of Classification Search
USPC ........................................................ 361/749
See application file for complete search history.

(56) References Cited

U.S. PATENT DOCUMENTS

| | | | |
|---|---|---|---|
| 2017/0261804 A1 | 9/2017 | Zhao et al. | |
| 2018/0314213 A1 | 11/2018 | Park et al. | |
| 2020/0288004 A1* | 9/2020 | Ren | G06F 3/041 |
| 2021/0333613 A1 | 10/2021 | Hiramoto et al. | |
| 2022/0124922 A1 | 4/2022 | Takatsu et al. | |

FOREIGN PATENT DOCUMENTS

| | | |
|---|---|---|
| CN | 206638268 U | 11/2017 |
| CN | 108810194 A | 11/2018 |
| CN | 208659183 U | 3/2019 |
| CN | 209471319 U | 10/2019 |
| CN | 108266758 B | 11/2019 |
| CN | 209600380 U | 11/2019 |
| CN | 209808329 U | 12/2019 |
| CN | 113287058 A | 8/2021 |
| CN | 114383644 A | 4/2022 |
| KR | 20150132895 A | 11/2015 |

* cited by examiner

DISPLAY MODULE, MANUFACTURE METHOD THEREFOR AND ELECTRIC DEVICE COMPRISING THE SAME

CROSS-REFERENCE TO RELATED APPLICATION(S)

This application is a Section 371 National Stage Application of International Application No. PCT/CN2022/094650, filed on May 24, 2022, the whole disclosure of which is incorporated herein by reference in its entirety.

TECHNICAL FIELD

The present disclosure relates to the field of electric technology, and particularly to a display module, a manufacture method therefor and an electric device comprising the same.

BACKGROUND

A display module is a module which may be mounted into an electric device for providing the display function. Typically, a display module has a supporting member, a display unit fixed on the supporting member and a control circuit board for controlling the display unit, and is mounted into an electric device such as a commercial appliance and a household appliance.

Many appliances vibrate inevitably. For example, commercial electric doors and household cleaning appliances such as a vacuum cleaner and an electric mop may result in vigorous vibration of the entirety of the appliances when the motor is operating. Meanwhile, the high operating temperature of the motor will render the display module to be in a high temperature environment. Display modules used for such electric devices need to be able to withstand vigorous vibration under a high temperature environment without damage. Furthermore, for the purpose of aesthetics and portability, those display modules also need to be miniaturized. With miniaturization of a module, the size of the circuit board will be decreased, which presents a higher requirement on the layout of numerous connectors on the circuit board.

There is still a need for improvement in the display module used for the electric device.

SUMMARY

In an aspect, the present disclosure provides a display module comprising:
a supporting intermediate frame and a transparent cover plate, wherein the supporting intermediate frame comprises a main plate portion extending in a direction the same as the transparent cover plate and a supporting lateral edge disposed to surround the main plate portion, and the supporting intermediate frame and the transparent cover plate form a first accommodation space;
a display unit disposed in the first accommodation space; and
a control board disposed at a side of the main plate portion away from the display unit, wherein the control board is electrically connected to the display unit to transmit a display signal to the display unit;
wherein the supporting intermediate frame further comprises at least one fixing portion disposed at a side of the main plate portion away from the display unit for fixing the control board.

Optionally, the fixing portion is a supporting fixing pillar comprising a supporting portion at a side close to the main plate portion and a connecting portion at a side away from the main plate portion;
wherein the connecting portion comprises a position-limiting portion and a fixing head, and one end of the position-limiting portion is connected to the supporting portion, and the other end of the position-limiting portion is connected to the fixing head; and
the control board comprises a position-limiting hole penetrating the control board, the position-limiting portion passes through the position-limiting hole, and the supporting portion and the fixing head are disposed at both sides of the control board respectively and cooperate with the position-limiting portion to fix the control board.

Optionally, a material for the fixing portion comprises a hot melt material.

Optionally, the display unit is electrically connected to the control board via a flexible circuit board; and
the main plate portion comprises a first through hole, and the flexible circuit board passes through the first through hole.

Optionally, the control board comprises a second through hole, and the flexible circuit board passes through the second through hole and is connected to a side of the control board away from the main plate portion; and
the display module further comprises a sealing tape, whose orthographic projection on an extending plane of the control board covers the second through hole.

Optionally, the supporting lateral edge and the main plate portion form a second accommodation space, and at least a part of the control board is disposed in the second accommodation space;
the supporting lateral edge comprises a first sub-supporting lateral edge, which is disposed to surround the control board and forms a lateral barrier for the second accommodation space; and a gap between the control board and the first sub-supporting lateral edge is filled with a sealing adhesive.

Optionally, the transparent cover plate is fixed to a side of the supporting lateral edge close to the transparent cover plate; and the first accommodation space and the second accommodation space as a whole form a sealed space.

Optionally, the supporting lateral edge comprises a second sub-supporting lateral edge and a third sub-supporting lateral edge disposed in parallel, wherein the second sub-supporting lateral edge is closer to the display unit than the third sub-supporting lateral edge, and the second sub-supporting lateral edge is directly connected to the main plate portion; and
the control board comprises an indicator lamp disposed at a side of the control board close to the transparent cover plate; and there is a gap between the second sub-supporting lateral edge and the third sub-supporting lateral edge, and when the indicator lamp is operating, light emitted by the indicator lamp is able to travel towards the transparent cover plate through the gap, and be transmitted through the transparent cover plate outwards.

Optionally, the transparent cover plate comprises a cover plate body and a light filtering layer disposed at a side of the cover plate body close to the display unit; the light filtering layer comprises a transparent region and a light shielding region disposed to surround the transparent region, and the transparent region is used for transmission of light emitted by the display unit; and the light filtering layer further comprises a translucent region, which is used for transmission of light emitted by the indicator lamp when the indicator lamp is operating and presents a color the same as or close to that of the light shielding region when the indicator lamp is not operating.

Optionally, the supporting lateral edge comprises a plurality of fourth sub-supporting lateral edges which connect the second sub-supporting lateral edge with the third sub-supporting lateral edge;
the fourth sub-supporting lateral edges extend in directions parallel to an extending surface of the control board; and
the fourth sub-supporting lateral edges are disposed close to the control board.

Optionally, the control board comprises a second through hole, and the flexible circuit board passes through the second through hole and is connected to a side of the control board away from the main plate portion; and
the control board comprises a control board body and a flexible circuit board connector disposed at a side of the control board body away from the main plate portion, the flexible circuit board connector is disposed adjacent to the second through hole, and the flexible circuit board connector comprises a flexible circuit board connecting terminal;
the second through hole is a strip-shaped through hole, and the flexible circuit board connecting terminal extends in a direction the same as an extending direction of the second through hole; and
the second through hole is disposed at an edge of the control board, and the flexible circuit board connector is closer to a center of the control board than the second through hole.

Optionally, the control board body comprises a first position-limiting hole disposed between the second through hole and a first edge of the control board body; and an orthographic projection of a center of the first position-limiting hole on a hole edge of the second through hole close to the first position-limiting hole is located within a middle ⅓ section of an entire length of the hole edge; and
the fixing portion comprises a first sub-fixing portion cooperating with the first position-limiting hole for fixing.

Optionally, the control board comprises a touch unit connector disposed at a side of the control board body away from the main plate portion; and
when a circle is drawn with a center of the control board body as an origin on a plane in which the touch unit connector is located, and the circle has an area covering ⅕ of an area of the control board, an orthographic projection of the touch unit connector on the control board body has a center inside the circle.

Optionally, the touch unit connector comprises a touch unit connecting terminal which is configured to allow a touch unit connecting cable to extend in a direction away from the flexible circuit board connector.

Optionally, the display module comprises a touch unit connected to the touch unit connecting terminal via the touch unit connecting cable;
the control board body comprises a second position-limiting hole which is disposed adjacent to a second edge of the control board, wherein the second edge is located opposite to the first edge;
the second position-limiting hole is disposed adjacent to the touch unit connecting cable; an orthographic projection of the touch unit connecting cable on the control board does not overlap with the second position-limiting hole; and
the fixing portion comprises a second sub-fixing portion cooperating with the second position-limiting hole for fixing.

Optionally, the control board comprises a power input connector disposed at a side of the control board body away from the main plate portion;
the power input connector is located at one side of a surface of the control board body divided by an orthographic projection of an axis of the touch unit connecting cable on the surface of the control board body; and
the power input connector comprises a power input connecting terminal which is configured such that a power connecting cable extends towards an edge of the control board body in a direction at an angle other than 0° and 180° with respect to an extending direction of the touch unit connecting cable.

Optionally, the control board comprises a speaker connector disposed at a side of the control board body away from the main plate portion; wherein
the speaker connector is located at the other side of the surface of the control board body divided by the orthographic projection of the axis of the touch unit connecting cable on the surface of the control board body, other than the side at which the power input connector is located; and
the speaker connector comprises a speaker connecting terminal which is configured such that the speaker connecting cable extends towards the edge of the control board body in a direction at an angle other than 0° and 180° with respect to the extending direction of the touch unit connecting cable.

Optionally, the power input connecting terminal and the speaker connecting terminal are configured such that a power input connecting cable and a speaker connecting cable extend in opposite directions; and
the power input connecting terminal is configured such that the power input connecting cable has an extending direction perpendicular to that of the touch unit connecting cable.

Optionally, the control board body further comprises a third position-limiting hole disposed between the flexible circuit board connector and the touch unit connector; wherein
the third position-limiting hole does not intersect a connecting line passing through a center of an orthographic projection of the touch unit connector on the control board body and a center of an orthographic projection of the flexible circuit board on the control board body; and
the fixing portion comprises a third sub-fixing portion cooperating with the third position-limiting hole for fixing.

Optionally, the control board comprises a processing unit disposed at a side of the control board body away from the main plate portion.

Optionally, the control board further comprises one or more selected from the group consisting of a Wi-Fi module, a Bluetooth module, a temperature sensing module, a humidity sensing module, an acceleration sensing module, a gravity sensing module, a gas detection module, and a geographic location positioning module.

Optionally, the control board body comprises a fourth position-limiting hole and fifth position-limiting hole, both of which are disposed close to edges of the control board body; wherein the fourth position-limiting hole is located on a connecting line traveling clockwise from the first position-limiting hole to the second position-limiting hole along the edges of the control board body; and the fifth position-limiting hole is located on a connecting line traveling counterclockwise from the first position-limiting hole to the second position-limiting hole along the edges of the control board body;

the fourth position-limiting hole and the fifth position-limiting hole are configured such that when drawing connecting lines from the first, second, fourth and fifth position-limiting holes to a center of the control board, an angle formed between each two connecting lines is greater than or equal to 45°; and the fixing portion comprises a fourth sub-fixing portion cooperating with the fourth position-limiting hole for fixing; and the fixing portion comprises a fifth sub-fixing portion cooperating with the fifth position-limiting hole for fixing.

Optionally, the control board body comprises a sixth position-limiting hole, wherein the sixth position-limiting hole and the third position-limiting hole are respectively located at two sides of the straight line in which the connecting line passes through the center of the orthographic projection of the touch unit connector on the control board body and the center of the orthographic projection of the flexible circuit board on the control board body;

a minimum distance between the sixth position-limiting hole and an edge of the control board body is greater than a minimum distance between any one of the first, second, fourth and fifth position-limiting holes and an edge of the control board body; and the fixing portion comprises a sixth sub-fixing portion cooperating with the sixth position-limiting hole for fixing.

Optionally, the control board body comprises a fourth position-limiting hole, a fifth position-limiting hole and a sixth position-limiting hole, wherein the first and the fourth position-limiting holes, the second and the fifth position-limiting holes, and the third and the sixth position-limiting holes are respectively arranged axially symmetrically with respect to an axis passing through the center of the control board body; and the fixing portion comprises a fourth sub-fixing portion cooperating with the fourth position-limiting hole for fixing; the fixing portion comprises a fifth sub-fixing portion cooperating with the fifth position-limiting hole for fixing; and the fixing portion comprises a sixth sub-fixing portion cooperating with the sixth position-limiting hole for fixing.

Optionally, the control board has a shape selected from the group consisting of circle, ellipse and N-sided polygon, wherein N is greater than or equal to 4.

Optionally, a maximum length of a line segment which is taken on an extending surface of the control board through a center point of the control board is less than or equal to 20 cm.

Optionally, the display unit has a shape selected from the group consisting of circle, ellipse and N-sided polygon, wherein N is greater than or equal to 4.

In another aspect, the present disclosure provides a method for manufacturing the display module as described above, wherein the control board is assembled into the supporting intermediate frame by steps of:

providing a non-hot-pressed supporting intermediate frame, wherein a hot melting plastic rod is provided on a supporting portion of a supporting fixing pillar, wherein the hot melting plastic rod has a height greater than that of a position-limiting hole;

passing the hot melting plastic rod through the position-limiting hole, so that a side of the control board comes into contact with the supporting portion;

heating and pressing a portion of the hot melting plastic rod protruding from the position-limiting hole with a hot melting press head to deform the portion into the fixing head, which is in contact with a side of the control board away from the main plate portion; and cooling and solidifying the fixing head.

In yet another aspect, the present disclosure provides an electric device comprising the display module as described above.

Optionally, the electric device is a household appliance comprising a motor.

Optionally, the household appliance is a household cleaning appliance.

DETAILED DESCRIPTION

Figure 1:
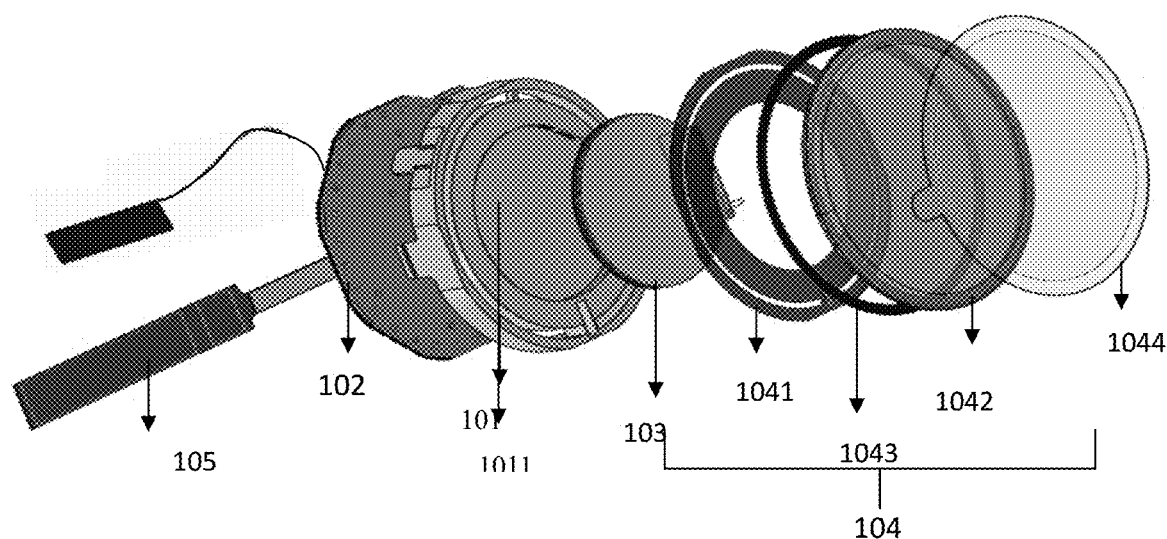
FIG. 1 shows an exploded view of an embodiment of a display module of the present disclosure.

A display module typically comprises a display unit and a control board electrically connected to the display unit for transmitting a display signal to the display unit. The electrical connection between the control board and the display unit may be achieved by a flexible circuit board. For the convenience of application, those components may be appropriately assembled into a display module. The assembled display module may be entirely mounted into an electric device, for example.

An example of the control board may be a printed circuit board (PCB). The printed circuit board may be provided with a processing chip, such as a microcontroller unit (MCU). The processing chip may be at least used to control the display content of the display unit. An example of the flexible circuit board may be a flexible printed cable (FPC). An example of the display unit may be a display screen.

The microcontroller unit is also known as a single chip microcomputer or a computer on a chip. In the microcontroller unit, the frequency and scale of a central processing unit are reduced as appropriate, and the peripheral interfaces such as a memory, a timer, a USB, an A/D converter, a UART, a PLC, and a DMA and the display unit drive circuit are all integrated into one single chip to form a chip-scale computer, thereby providing various combined control for different application scenarios. In the present disclosure, an MCU board is sometimes used as an example of the control board. The MCU board refers to a printed integrated circuit board comprising a microcontroller unit integrated circuit (MCU IC), and may further comprise accessories such as an FPC connector, a USB, a drive single chip microcomputer, a main control input connector, touch unit connector, a LED lamp, and a Wi-Fi drive. It is used to control the display unit. Specifically, the single chip microcomputer may receive an operation signal by the user from the touch unit connector or the main control input connector, and process it into a control signal accordingly. The control signal of the display unit is transmitted through the FPC connector to the display unit via the FPC, and controls the operation of the display unit. The control signal of the LED lamp may control the LED lamp through the circuit inside the control board. Data exchange with the outside may be performed through the USB and Wi-Fi drive accessories. The control board may further comprise a power input connector for powering the control board. The control board may also be provided with a signal interaction connector for transmitting a signal between the control board of the display module and the control board of the complete machine. The signal interaction connector may be integrated with the power input connector.

In the display module of the present disclosure, an FPC is sometimes used as an example of the flexible circuit board. It is used to connect the microcontroller unit with the display unit controlled thereby. Typically, the FPC may be fabricated by forming a copper foil-cladding laminate with polyimide as a substrate by a subtraction method.

In the display module, the display unit controlled by the control board via the flexible circuit board may be diverse. For example, it may be a liquid crystal module (LCM), i.e., an assembly where a liquid crystal display device, connectors, peripheral circuits (such as a controller, a drive and the like), a backlight source, a structural member and the like are assembled together. It may also be display screens, such as a LED display module. The type of the display unit is not particularly limited in the present disclosure.

In the display module comprising a control board and a display unit, a supporting component is required for supporting and fixing them. In the related art, a conventional manner in which the control board is fixed to the supporting component such as a supporting plate comprises opening through holes at four corners of the control board and screwing bolts passing through the through holes into nuts provided in the supporting plate, thereby fixing the control board to the supporting plate. As an example, according to industrial standards, a flat head M2.5 mm bolt with a bolt head diameter between 5 and 6 mm is generally selected, and a safety space between 8 and 10 mm needs to be reserved around the bolt. Such a fixing manner takes up a large space, and it is difficult to meet the requirements for the component arrangement and wiring when the display module is miniaturized. For example, the display module using a 2-inch display unit should generally have an outline size of 100 mm or less. In such a case, the control board may need to integrate numerous accessories such as an MCU IC, an FPC connector, an FPC through hole, a USB, a drive single chip microcomputer, a main control input connector, a touch unit connector, a LED lamp, and a Wi-Fi drive, and the space for wiring is very limited. Also, many connectors for plugging cables of desired functions need to be positioned within the outline of the product, or otherwise, spatial interference may occur between the module and the complete machine of the electric device using the module, such that the components cannot be assembled. In this case, it is also very difficult to find sufficient space for changing the bolt positions from the four corners to the interior of the product.

The assembling and fixing manner of the display module also affect its performance. For example, when the electric device is operating under a high temperature and vigorous vibration condition, the control board mounted in the display module thereof by tightening the bolt is usually deformed and bent, and the connection of the connecting fingers between the flexible circuit board in the display module for connecting the display unit and the control unit and its connector is usually shifted or even mismatched, resulting in poor display function, or even a proportion of board cable is damaged.

If the size of the bolt is reduced for the convenience of component arrangement and wiring, the costs for fabrication and mounting are increased, while it is more difficult to maintain a firm fixation under a high temperature and vigorous vibration condition.

Furthermore, after the control board is fixed by passing the bolt through the through hole, although dust may be prevented from passing through, it is not possible to prevent moisture from passing through. The entrance of moisture into the interior of the module may result in the formation of a condensate on the cover plate of the display surface, thereby affecting the display effect.

In an embodiment of the present disclosure, a fixing portion provided in the supporting component is used to replace the bolt for fixing the control board to the supporting component.

In an embodiment of the present disclosure, provided is a display module comprising:
  a supporting intermediate frame and a transparent cover plate, wherein the supporting intermediate frame comprises a main plate portion extending in a direction the same as the transparent cover plate and a supporting lateral edge disposed to surround the main plate portion, and the supporting intermediate frame and the transparent cover plate form a first accommodation space;

a display unit disposed in the first accommodation space; and a control board disposed at a side of the main plate portion away from the display unit (i.e., disposed on a back surface of the main plate portion); wherein the control board is electrically connected to the display unit to transmit a display signal to the display unit;

wherein the supporting intermediate frame further comprises at least one fixing portion disposed at a side of the main plate portion away from the display unit for fixing the control board.

The display module of the present disclosure uses the supporting intermediate frame as a supporting portion to support the display unit and the control board. The display module of the present disclosure further comprises a transparent cover plate for protecting the display unit. The transparent cover plate refers to a plate at least a portion of which is transparent. Having a transparent portion is essential for the display. The body of the supporting intermediate frame has a plate shape and is referred to as the main plate portion. The supporting intermediate frame comprises a main plate portion extending in a direction the same as an extending direction of the transparent cover plate and a supporting lateral edge disposed to surround the main plate portion. The supporting lateral edge may have a shape different from the plate shape of the main plate portion.

The supporting intermediate frame and the transparent cover plate may form a first accommodation space for accommodating the display unit. Specifically, the display unit is disposed between the supporting body and the transparent cover plate. The light-exiting surface (or the front surface) of the display unit faces the transparent cover plate. The supporting intermediate frame is used to provide support for the display unit and the transparent cover plate.

In a particular embodiment, the display unit and the transparent cover plate form a structure, in which they are fully attached to each other. For example, there may be no interaction force between the main plate portion and the display unit. For example, there may be a gap between the main plate portion and the display unit. In such a case, the supporting lateral edge is used to provide support for the transparent cover plate. Such a design is convenient for the assembling of the supporting intermediate frame, the transparent cover plate and the display unit.

The supporting intermediate frame is also used to provide support for the control board. The control board is disposed at a side of the main plate portion away from the display unit, and is electrically connected to the display unit to transmit a display signal to the display unit.

Thus, the display unit and the control board are respectively disposed at two sides of the main plate portion. For the convenience of description, it may be specified that the display unit is disposed on the front surface of the main plate portion, and the control board is disposed on the back surface of the main plate portion. In the present disclosure, the term "front surface" or "front direction" refers to a direction of the light-exiting surface of a display unit, and the term "back surface" or "back direction" refers to a direction opposite thereto. In other words, when viewing from a position at which a user of the display module normally views an image displayed by the display unit, the display unit is located at a proximal end, the control board is located at a distal end, and the supporting intermediate frame is located between them. A surface of each of the components facing the user is called the front surface, and the other surface is called the back surface.

The supporting intermediate frame is provided with a fixing portion disposed at a side of the main plate portion away from display unit, i.e., the back surface of the main plate portion, for fixing the control board. The thus formed display module comprises a transparent cover plate, a display unit, a supporting intermediate frame with a fixing portion on a main plate portion and a control board fixed by means of the fixing portion.

When the fixing portion disposed on a portion of the back surface of the main plate portion as the supporting intermediate frame, rather than a bolt, is used to fix the control board, the aforementioned shortcomings related to the bolt fixation may be at least partially avoided.

The inventors have found that the problem of component arrangement and wiring in a small size outline may be solved by using the fixing portion on the back surface of the main plate portion to replace the bolt for fixing. In an embodiment, a through position-limiting hole is provided on the control board, and a protruding hot melting plastic cylindrical pillar is provided on the back surface of the main plate portion as the fixing portion. The plastic cylindrical pillar is passed through the position-limiting hole, and its protruding end is flattened by hot melting and pressing to function as "riveting", thereby fixing the control board. As compared to the bolt fixation, the fixing portion formed by the hot-meltable plastic cylindrical pillar may not only have significantly reduced size to save space, but also have better ease of mounting and cost. At least one fixing portion is needed, and there may be a plurality of fixing portions.

Also, the display module may be easily sealed and encapsulated, such that moisture from outside does not enter into the interior thereof, thereby preventing the moisture condensed on the inner wall of the transparent cover plate from affecting the display effect.

In an embodiment, the fixing portion is a supporting fixing pillar comprising a supporting portion at a side close to the main plate portion and a connecting portion at a side away from the main plate portion;

wherein the connecting portion comprises a position-limiting portion and a fixing head, and one end of the position-limiting portion is connected to the supporting portion, and the other end of the position-limiting portion is connected to the fixing head; and the control board comprises a position-limiting hole penetrating the control board, the position-limiting portion passes through the position-limiting hole, and the supporting portion and the fixing head are disposed at both sides of the control board respectively and cooperate with the position-limiting portion to fix the control board.

The control board may be provided with at least one position-limiting hole for cooperating with the connecting portion of the supporting fixing pillar on the main plate portion to fix the control board to the main plate portion. A plurality of distributed supporting fixing pillars and corresponding position-limiting holes may be provided to fix the control board firmly.

The inventors have surprisingly found that when a columnar body with a certain cross section is used as the fixing portion, if the columnar structure directly protrudes from the main plate portion, a stress concentration may occur at the bottom of the columnar body after fixing because of the small cross section area of the columnar body, which may result in partial deformation of the main plate portion in a direction perpendicular to the plate surface. Such deformation of the main plate portion for fixing the control board will also result in deformation of the control board and uneven stress. Particularly in the case of high temperature and vigorous vibration, this will very easily result in the damage of the control board, thereby leading to the failure of the display module.

With respect to such a problem, the supporting fixing pillar of the present disclosure may comprise a supporting portion disposed at a side close to the main plate portion and a connecting portion at a side away from the main plate portion. In other words, it may comprise a supporting portion at its bottom and a fixing portion at its top. For the convenience of description, in the present disclosure, the terms "bottom" and "top" are relative to the substrate on which the structure is located. Here, the bottom and top of the supporting fixing pillar are relative to the main plate portion as its substrate. That is, one end of the supporting fixing pillar at a side close to the main plate portion is its bottom, and the other end at a side away from main plate portion is its top. The supporting fixing pillar of the present disclosure is disposed on the back surface of the main plate portion, and may provide sufficient support for the control board in a direction perpendicular to the plate surface of the main plate portion. As compared to the manner in which the main plate portion is laterally supported and fixed at the edges of the main plate portion in a direction parallel to the extending direction of the main plate portion, the supporting fixing pillar of the present disclosure provides effective support for the control board in the thickness direction in which the control board easily deforms. In particular, when it is disposed in the middle of the module, the collapse deformation in the middle of the control board may be effectively prevented.

The supporting fixing pillar of the present disclosure comprises a special supporting portion for serving as a basis of the connecting portion and for supporting the control board. The position-limiting portion of the connecting portion may protrude from the center on a basis of the supporting portion to cooperate with the position-limiting hole of the control board. When mounted together with the control board, the periphery of the top of the supporting portion may be in contact with the board surface around the position-limiting hole of the control board. As compared to the position-limiting portion of the connecting portion on its top passing through the position-limiting hole, the supporting portion has a larger cross section area. Therefore, as compared to the position-limiting portion directly protruding from the main plate portion, this may significantly reduce the stress concentration and deformation therefrom at the supporting and fixing position. Furthermore, the height of the supporting portion separates the control board apart from the main plate portion. As compared to the case where the control board is closely attached to the main plate portion when no supporting portion is provided, the vibration of the microcontroller unit with the main plate portion may be significantly reduced, thereby effectively reducing failure.

The connecting portion is provided at a side of the supporting portion away from the main plate portion, and comprises a position-limiting portion and a fixing head. The position-limiting portion passes through the position-limiting hole, and the fixing head is in contact with a surface around the position-limiting hole at a side of the control board away from main plate portion. The distance between a side of the fixing head towards the control board and a side of the supporting portion towards the control board is exactly the thickness of the control board, such that the control board is sandwiched therebetween. The position-limiting portion passes through the position-limiting hole, such that the control board does not move relative to the main plate portion in the extending direction of the main plate portion. Thus, the supporting portion, the fixing head and the position-limiting portion cooperate with each other to fix the control board.

The supporting portion and the position-limiting portion protrude from the main plate portion, and may be formed integrally with the main plate portion.

The fixing head may have the same material as the position-limiting portion and may be integrated with the position-limiting portion, and may also be attached to the position-limiting portion. In an embodiment, before mounting, the position-limiting portion may have a length greater than the height of the position-limiting hole, and the excess portion may form the fixing head by hot melting and pressing. In another embodiment, the fixing head is formed from a separately applied adhesive or a separately applied hot melt material and bound to the top end of the position-limiting portion.

In an embodiment, the position-limiting portion passes through the position-limiting hole and has a height the same as that of the position-limiting hole; the fixing head covers the position-limiting hole and is in contact with the back surface of the control board; and the supporting portion is in contact with the front surface of the control board, such that the main plate portion supports the control board by means of the supporting portion and fixes the control board by means of the fixing head. Ideally, in the direction of the plane extending parallel to the control board, the position-limiting hole may have an area the same as the cross section area of the position-limiting portion to achieve the optimum position-limiting effect. However, in practice, the position-limiting hole has an area slightly greater than the cross section area of the position-limiting portion in the hole, such that the position-limiting portion may easily pass through the position-limiting hole during mounting.

A material for the fixing portion may comprise a hot melt material. The hot melt material may allow the control board to be fixed to the supporting intermediate frame by a hot pressing process. An example of the hot melt material is polycarbonate (PC).

In an embodiment, the main plate portion, the supporting portion, the position-limiting portion and the fixing portion are all formed from the same hot melt material.

The fixing head may be formed by subjecting the hot melt material to a hot pressing process, and functions as "riveting".

Typically, the fixing head is formed by:
providing a non-hot-pressed supporting intermediate frame, wherein a hot melting plastic rod with a height greater than that of a location hole is provided on a supporting portion of a supporting fixing pillar;
passing the hot melting plastic rod through the position-limiting hole to allow the front surface of the control board to be in contact with the supporting portion;
heating and pressing a portion of the hot melting plastic rod protruding from the position-limiting hole with a hot melting press head to deform the portion into the fixing head, which is in contact with the back surface the control board; and
cooling and solidifying the fixing head.

The fixing head formed by hot pressing is fully pressed against the back surface of the control board, such that the front surface of the control board is firmly attached to the top of the supporting portion of the main plate portion. The main plate portion supports the control board by means of the supporting portion and fixes the control board by means of the fixing head. Typically, the fixing head has a round cake shape. The fixing head formed by hot pressing may also have a good function of insulating the position-limiting hole from moisture.

As described above, the position-limiting portion passes the position-limiting hole, and functions to laterally limit the position of the control board. The position-limiting portion has a diameter much smaller than that of a conventional bolt, and the fixing head also has a diameter much smaller than a conventional bolt, such that space may be saved. Thus, the flexibility of design for supporting and fixing sites is significantly improved, which effectively solves the problem of component arrangement and wiring.

Through a plurality of supporting fixing pillars with a supporting portion disposed on the back surface of the main plate portion, a miniaturized display module which can operate under a high temperature and vigorous vibration condition may be achieved, wherein the control board will not be damaged easily.

FIG. 1 shows an exploded view of an embodiment of a display module of the present disclosure. Here, a transparent cover plate 104 may comprise a ring-shaped optical filter 1041, a cover plate body 1042, a double side adhesive tape 1043 and a protection film 1044. The display unit 103 is disposed in a first accommodation space between a supporting intermediate frame 101 and the transparent cover plate 104, i.e., on the front surface of the supporting intermediate frame 101. The control board 102 is disposed at a side of a main plate portion 1011 of the supporting intermediate frame 101 away from the display unit 103, i.e., on the back surface of the supporting intermediate frame 101.

FIG. 1 also shows that the display module may optionally comprise a touch slide bar 106, whose touch operation end protrudes from an edge of the supporting intermediate frame. A user may control the control board by the touch slide bar, further controlling the display unit disposed on the front surface of the supporting intermediate frame via a flexible circuit board.

Figure 2:
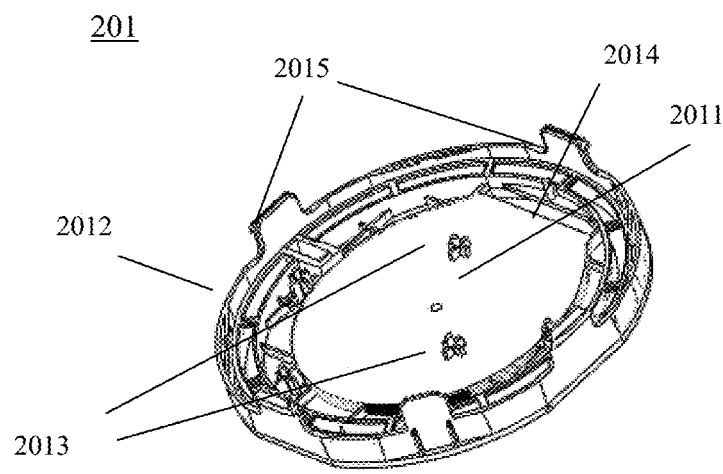
FIG. 2 shows an external view of an embodiment of a supporting intermediate frame which has not yet been bound to a control board by hot melting.

FIG. 2 shows an external view of an embodiment of a supporting intermediate frame 201 which has not yet been bound to a control board by hot melting. This figure mainly shows the state on its back surface. This figure shows a main plate portion 2011, a supporting lateral edge 2012, supporting fixing pillars 2013 and fasteners 2015.

Figure 3:
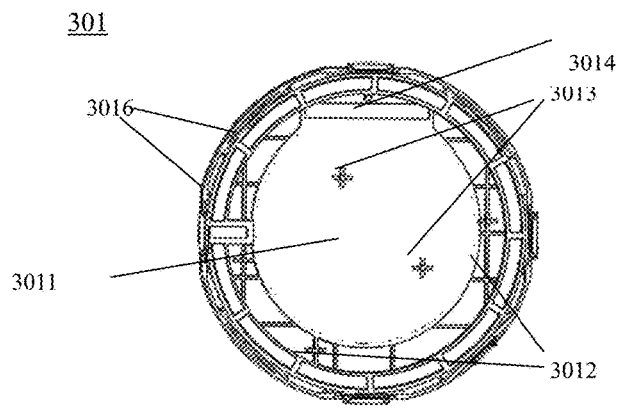
FIG. 3 shows a front view of a back surface of the control board in FIG. 2.

FIG. 3 shows a front view of a back surface of the supporting intermediate frame in FIG. 2. Here, cross shapes on the main plate portion 3011 of the supporting intermediate frame 301 represent supporting fixing pillars 3013. FIG. 3 also shows supporting lateral edges 3012 on the periphery of the back surface and gaps 3016 through which light emitted by an indicator lamp described later may pass.

Figure 4:
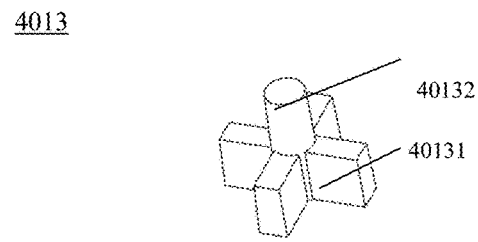
FIG. 4 shows an enlarged view of a supporting fixing pillar in FIG. 3.

FIG. 4 shows a supporting fixing pillar 4013. As can be seen, it is consisted of a cross-shaped supporting portion 40131 and a hot melting plastic pillar 40132 on the top of the supporting portion. When the control board is mounted together with the supporting intermediate frame having such a supporting fixing pillar, the plastic pillar 40132 penetrates the position-limiting hole in the control board, and its top will be heated and pressed to deform into a round-cake-shaped fixing head, and the undeformed portion will become a position-limiting portion, thereby fixing the control board.

Figure 5:
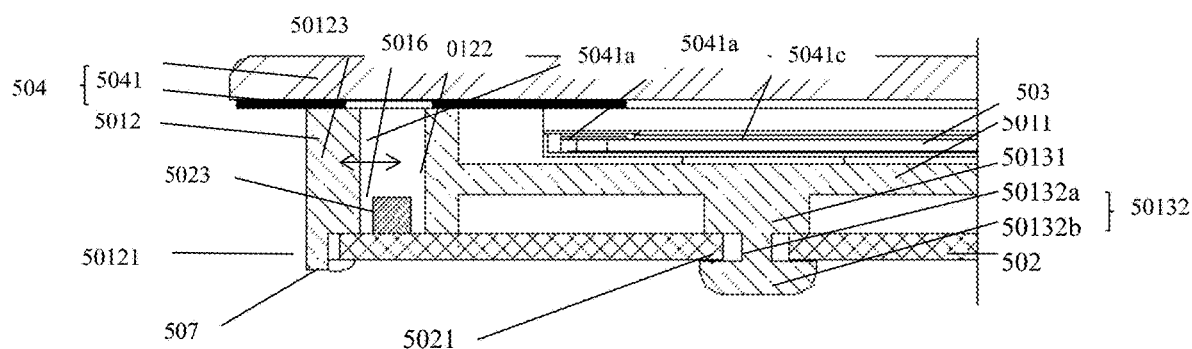
FIG. 5 shows a supporting fixing pillar with a fixing head after binding.

FIG. 5 shows an embodiment wherein a supporting fixing pillar 5013 with a fixing head is shown. In this figure, 5011 represents a main plate portion of a supporting intermediate frame, 50131 represents a supporting portion of a supporting fixing pillar 5013, 50132 represents a connecting portion of the supporting fixing pillar 5013, 50132a represents a position-limiting portion, 50132b represents a fixing head, 502 represents a control board, and 5021 represents a position-limiting hole. As can be seen, the supporting portion 50131, the position-limiting portion 50132a and the fixing head 50132b cooperate with each other to fix the control board 502.

The supporting portion may have any suitable shape. Preferably, the supporting portion may have a cross shape as shown in FIG. 4, or may have an "I" shape or an "H" shape, for example. The supporting portion of those shapes forms a reinforcement rib, is easy to be fabricated, and may provide good mechanical reinforcement and damping effects. The shape of the supporting portion is more preferably a cross shape, because it has better strength.

In an embodiment, the position-limiting portion has a columnar shape with a diameter of 1.2 mm+0.05 mm; the position-limiting hole has a cylindrical shape with a diameter of 1.4 mm+0.05 mm; and the fixing head has a round-cake shape with a diameter of 2.0 mm±0.05 mm and a height of 0.4 mm±0.01 mm. In order to save space, the diameter of the position-limiting portion may be preferably designed to be a minimum diameter of about 1.2 mm which may be made by using a conventional non-high precision mold for plastic. Accordingly, the size of the position-limiting hole is slightly larger than the diameter of the position-limiting portion to allow the position-limiting portion to penetrate therethrough, and is about 1.4 mm. The size range of the fixing head only needs to cover the position-limiting hole to provide firm binding, and may be as small as possible to save space. Therefore, the fixing head with a diameter of about 2 mm and a thickness of about 0.4 mm is suitable.

In an embodiment, the size of the supporting portion may be substantially the same as that of the corresponding fixing head to perform the fixation. As shown in FIG. 5, the supporting portion 50131 and the fixing head 50132b have substantially the same size. Larger supporting portion is also possible. Optionally, the cross section area of the bottom of the supporting portion may be greater than that of its top, thereby further preventing stress concentration while saving the contact area.

In an embodiment, the fixing head in the supporting fixing pillar is a glue dispensing portion. That is, glue is dispensed on the top of the position-limiting portion penetrating the position-limiting hole, and then solidified and adhered to the position-limiting portion to form the fixing head which cooperates with the position-limiting portion and the supporting portion for fixing the control board.

In an example, the fixing head may be formed by hot pressing. Nevertheless, after the fixing head is broken to dismount the control board, the original supporting fixing pillar cannot be formed into the fixing head by a hot melting process any more. For this case, the removed fixing head may be repaired by glue dispensing as described above.

Specifically, quickly solidifying glue may be selected for glue dispensing in order to transport and package after completion as quickly as hot melting. However, in order to maintain the shape of the glue, a UV curable adhesive may be preferably used instead of the quickly drying glue. Furthermore, if the package period has low requirement on the production speed, glue dispensing may also be directly used. Alternatively, a hot-melt adhesive with a low flowability may also be used, and it is applied and then hot molten for fixation.

In an embodiment, the display unit is electrically connected to the control board via a flexible circuit board; and the main plate portion comprises a first through hole, and the flexible circuit board passes through the first through hole.

The first through hole is used to allow the flexible circuit board to penetrate the main plate portion to connect the display unit and the control board disposed respectively on two sides of the main plate portion. The first through hole may be an elongated strip-shaped through hole.

2014 in FIGS. 2 and 3014 in FIG. 3 show the elongated strip-shaped first through hole.

In an embodiment, the control board comprises a second through hole, and the flexible circuit board passes through the second through hole and is connected to a side of the control board away from the main plate portion; and the display module further comprises a sealing tape, whose orthographic projection on an extending plane of the control board covers the second through hole.

It may be understood that when the second through hole is sealed by a sealing tape, moisture may be prevented from entering the first accommodation space, ensuring the display reliability of the display module.

When the flexible circuit board connector on the control board is disposed at a side of the control board away from the main plate portion, the second through hole is used to allow the flexible circuit board to penetrate the control board to be connected to the flexible circuit board connector. The second through hole may also be an elongated strip-shaped through hole.

For example, when the flexible circuit board is an FPC, the control board has a second through hole and an FPC connector mounted on its back surface. The second through hole in the control board is aligned with the first through hole in the main plate portion. The FPC starts from the display unit, penetrates the first through hole in the main plate portion and the second through hole in the control board sequentially, and is connected to the FPC connector.

The second through hole and the first through hole form a channel passing from the outside of the control board to the display unit. In order to improve the sealing property, the display module further comprises a sealing tape, whose orthographic projection on an extending plane of the control board covers the second through hole. The sealing tape may seal the second through hole, while fixing the flexible circuit board. More preferably, the orthographic projection of the sealing tape on the extending plane of the control board covers the second through hole, at least a portion of the flexible circuit board connector, and the flexible circuit board running between the second through hole and the flexible circuit board connector. Such a large sealing tape may reduce the possibility of generating a gap on pasting, providing more effective sealing.

In an embodiment, on the back surface of the control board, the second through hole is sealed by a high temperature resistant adhesive tape. The high temperature resistant adhesive tape has a relatively small thickness and a relatively soft material which has little stress. The adhesive tape is fully attached to the periphery of the second through hole, and no adhesion failure occurs when the flexible circuit board generates heat, such that the product is sealed from dust and moisture.

Figure 8:
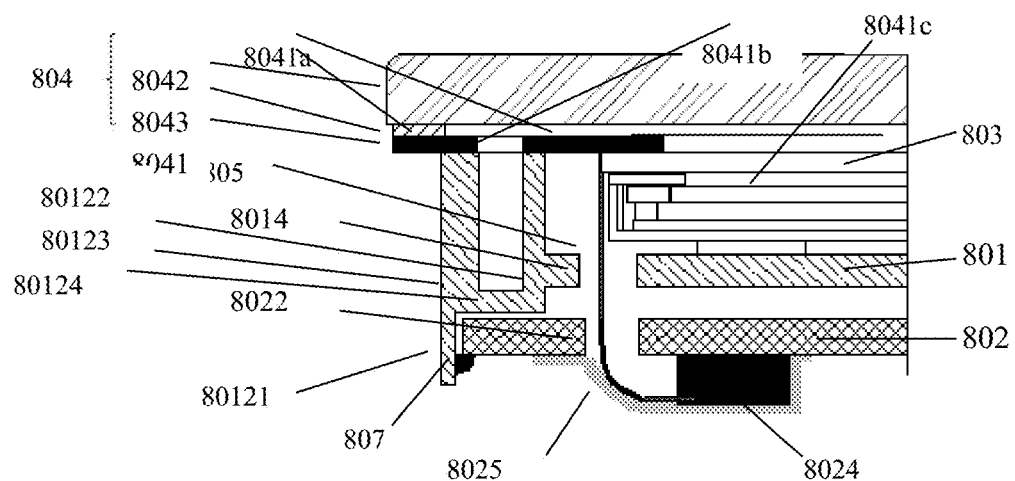
FIG. 8 shows a schematic diagram of the connection of a flexible circuit board.

FIG. 8 shows a cross section structure though the second through hole. In this figure, 801 represents a supporting intermediate frame, 802 represents a control board, 803 represents a display unit, 804 represents a transparent cover plate, and 805 represents a flexible circuit board. The flexible circuit board 805 starts from the display unit 803, penetrates the first through hole 8014 of the supporting intermediate frame 801 and the second through hole 8022 on the control board, and is connected to the flexible circuit board connector 8024 on the back surface of the control board 802. As shown in FIG. 8, a high temperature resistant adhesive tape 8025 seals the second through hole 8022, and also covers the flexible circuit board 805 and the flexible circuit board connector 8024.

In an embodiment, the supporting lateral edge and the main plate portion form a second accommodation space, and at least a part of the control board is disposed in the second accommodation space;
the supporting lateral edge comprises a first sub-supporting lateral edge, which is disposed to surround the control board and forms a lateral barrier for the second accommodation space; and
a gap between the control board and the first sub-supporting lateral edge is filled with a sealing adhesive.

FIG. 5 illustrates a first sub-supporting lateral edge 50121. The first sub-supporting lateral edge 50121 becomes a lateral barrier, forming a lateral barrier for the second accommodation space to accommodate the control board. A gap between the control board 502 and the first sub-supporting lateral edge 5021 is filled with a sealing adhesive 507. Specifically, the sealing adhesive 507 is disposed at a side of the gap between the control board 502 and the first sub-supporting lateral edge 5021 away from control board, and/or, the sealing adhesive 507 is disposed in the gap between the control board 502 and the first sub-supporting lateral edge 5021. The sealing adhesive may prevent moisture and dust from entering the interior of the display module via the gap, thereby achieving a dust-proof and moisture-proof sealing, and may also have a fixing function.

FIG. 8 also shows a first sub-supporting lateral edge 80121 as a lateral barrier. As shown in FIG. 8, a gap between the first sub-supporting lateral edge 80121 and the control board 802 is sealed by a sealing adhesive 807.

Incidentally, the cross section view of FIG. 5 shows a cross section through the fixing portion and the indicator lamp, whereas the schematic diagram of FIG. 8 shows a cross section which does not pass through the fixing portion and indicator lamp, but passes through the first through hole, the second through hole, the flexible circuit board connector and the fourth sub-supporting lateral edges.

In an embodiment, the transparent cover plate is fixed to a side of the supporting lateral edge close to the transparent cover plate; and
the first accommodation space and the second accommodation space as a whole form a sealed space.

As shown in FIG. 5, the transparent cover plate 504 is also fixed to a side of the supporting lateral edge 5012 close thereto. The fixing may be carried out by bonding with a sealing adhesive. The transparent cover plate 504 may comprise an optical filter 5041 and a cover plate body 5042. The cover plate body may be, for example, a glass cover plate. The supporting lateral edge 5012 is fixed to the transparent cover plate on one side and forms a sealing, and a first sub-supporting lateral edge 50121 included therein cooperates with the control board to form a sealing, such that the first accommodation space and the second accommodation space as a whole may form a sealed space. Both of them may be in communication with each other via the first through hole in the main plate portion as described previously. However, this space is sealed from outside. In an embodiment, the front surface of the supporting lateral edge of the supporting intermediate frame may be closely bound and fixed to the transparent cover plate, for example, by adhering and fixing with a sealing adhesive; a gap between the first sub-supporting lateral edge on a back surface of the supporting intermediate frame and the control board is filled by a sealing adhesive; the second through hole in the control board is sealed by a sealing tape; and the position-limiting hole in the control board is sealed by the fixing head. FIG. 8 also shows the same structure. In FIG. 8, an optional double side adhesive 8043 is further provided between the light filtering layer 8041 and the cover plate body 8042 of the transparent cover plate 804. When the light filtering layer is a separate optical filter, it may be adhered onto the cover plate body by the double side adhesive. When the light filtering layer is a film layer directly formed on the cover plate body, for example, a film layer directly deposited or coated on the cover plate, the double side adhesive may be omitted.

Figure 6:
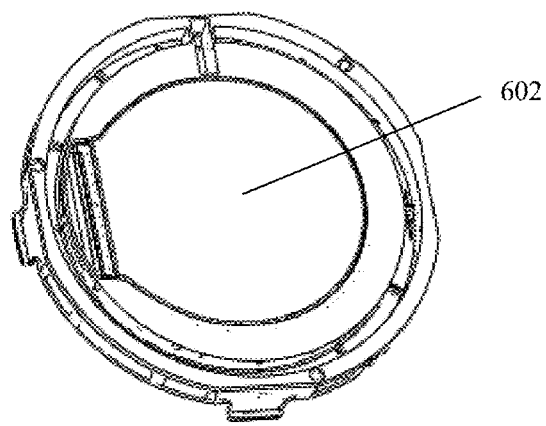
FIG. 6 shows an external view of an embodiment of a supporting intermediate frame.

FIG. 6 shows an external view of an embodiment of a supporting intermediate frame, wherein a display unit 602 is embedded onto a front surface.

Figure 7:
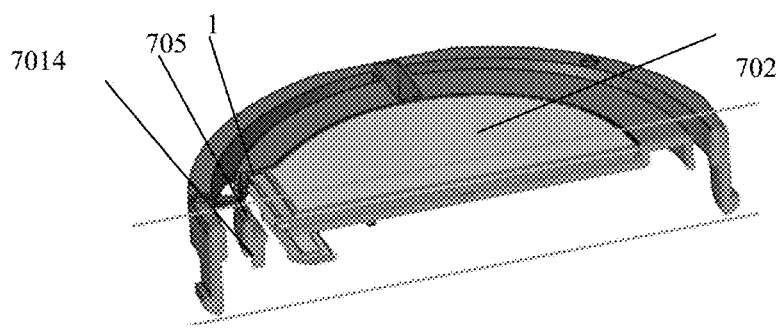
FIG. 7 shows an external view of the supporting intermediate frame of FIG. 6 which has been cut from the middle.

FIG. 7 shows an external view of the supporting intermediate frame of FIG. 6 which has been cut from the middle. FIG. 7 shows a flexible circuit board 705 which is connected to a display unit 702 via a first through hole 7014 in a supporting intermediate frame 701 and penetrates the first through hole 7014. FIG. 7 also shows a cross section of an embodiment of a supporting lateral edge surround a main plate portion, wherein the supporting lateral edge comprises a second sub-supporting lateral edge and a third sub-supporting lateral edge as described below.

In an embodiment, the supporting lateral edge comprises a second sub-supporting lateral edge and a third sub-supporting lateral edge disposed in parallel, wherein the second sub-supporting lateral edge is closer to the display unit than the third sub-supporting lateral edge, and the second sub-supporting lateral edge is directly connected to the main plate portion. Specifically, a surface of the third sub-supporting lateral edge away from the second sub-supporting lateral edge may be the same surface as a surface of the first sub-supporting lateral edge away from the control board. The same surface may be understood as that there is no obvious height difference when the surface extends.

Specifically, the supporting lateral edge itself may be prepared by one time process. Specifically, the first supporting lateral edge, the second sub-supporting lateral edge and the third supporting lateral edge may be prepared from the same material by one time process. Specifically, the supporting lateral edge and the main plate portion may be prepared by one time process. One time process may be a molding process, in particular an injection molding process. The main plate and the supporting lateral edge may be prepared by injection molding a thermoplastic material.

In a specific example, the control board comprises an indicator lamp disposed at a side of the control board close to the transparent cover plate; and there is a gap between the second sub-supporting lateral edge and the third sub-supporting lateral edge, and when the indicator lamp is operating, light emitted by the indicator lamp is able to travel towards the transparent cover plate through the gap, and be transmitted through the transparent cover plate outwards.

The control board may be provided with an indicator lamp mounted on its front surface. An example of the indicator lamp may be an LED lamp. It may be a decorative lamp having a decorative function, an indicator lamp having an indicative function, or the like. As such, an additional visual effect may be provided to the user in addition to the display unit. The indicator lamp is controlled by the control board. Because it is a component of the control board, it is disposed at a side of the main plate portion away from the display unit. For the purpose that the user may see the indicator lamp from the front surface of the display module, a gap through which the light emitted by it may pass should be provided in the supporting intermediate frame. In other words, the supporting intermediate frame may have an indicator lamp light-exiting hole in alignment with the indicator lamp. The indicator lamp light-exiting hole allows light emitted by the indicator lamp of the control board on the back surface of the supporting intermediate frame outputting from the front surface of the display module, and not being blocked by the supporting intermediate frame. Optionally, the indicator lamp on the front surface of the control board is configured to be a lamp ring around the peripheral area of the plate to avoid occupying the display space of the central display unit. What is fabricated on the peripheral area is not limited to the lamp ring, and may also be LED characters needed by the product, or the like.

Accordingly, an indicator lamp light-exiting hole is provided in the supporting intermediate frame, and allows light emitted by the indicator lamp of the control board on the back surface of the supporting intermediate frame to output from the front surface of the display module, and not to be blocked by the supporting intermediate frame. Thus, the indicator lamp light-exiting hole is disposed in a position in alignment with the indicator lamp.

Figure 9:
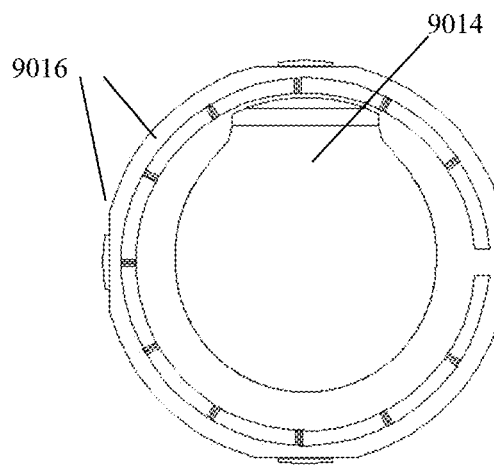
FIG. 9 shows a front view of a main plate portion with a first through hole.
Figure 12:
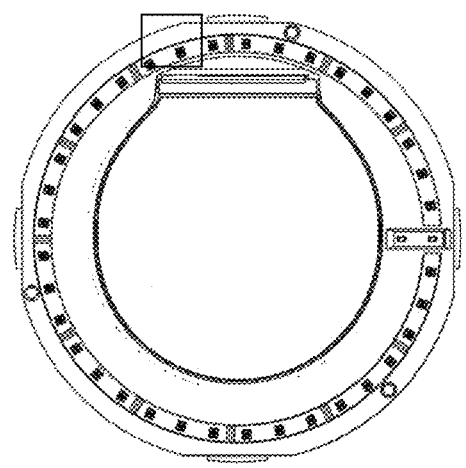
FIG. 12 shows a schematic diagram of a double-color lamp ring.
Figure 13:
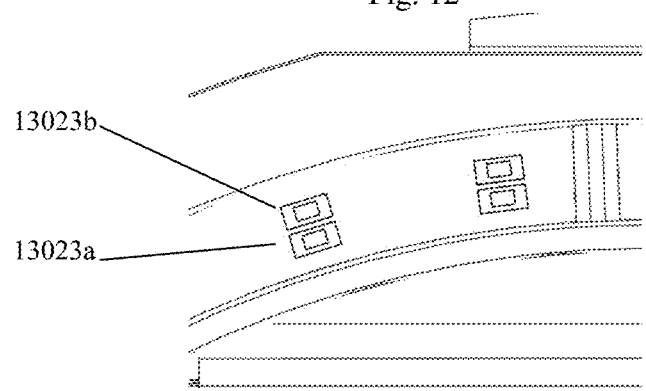
FIG. 13 is an enlarged view of the block area at top in FIG. 12.

In an embodiment, the indicator lamp light-exiting hole refers to a plurality of holes arranged along the periphery of the supporting intermediate frame. As shown in FIG. 9, the indicator lamp light-exiting holes or gaps 9016 may be arranged on the periphery of the supporting intermediate frame. Accordingly, the LED lamps of the control board are also arranged on the periphery. FIG. 12 shows a schematic diagram of a double-color lamp ring. It has two circles of LED lamps inside and outside respectively, which may display different colors, and may be exposed from the indicator lamp light-exiting holes on the periphery. FIG. 13 is an enlarged view of the top block area in FIG. 12. As can be seen, the inner circle of LED lamps 13023a and the outer circle of LED lamps 13023b are exposed to the front surface through the indicator lamp light-exiting holes. In an embodiment, the inner circle may be red, and the outer circle may be blue. Specifically, the through hole in the boundary ring region corresponds to the lamp ring. The LED lamp ring is integrated onto the circuit board of the microcontroller unit, and is classified into two colors of red and blue, with each pair of red and blue LED lamps as one group. Every 3 groups of LEDs are located within one indicator lamp light-exiting hole.

FIG. 5 shows an embodiment wherein an indicator lamp is provided on the periphery of the control board. As shown in FIG. 5, the control board 502 comprises an indicator lamp 5023 which may be, for example, an LED lamp. The indicator lamp 5023 is disposed at a side of the control board close to the transparent cover plate, i.e., on its front surface. When the indicator lamp is provided in a region outside of the main plate portion, that is, in a region of the supporting lateral edge, as shown in FIG. 5, the supporting lateral edge may comprise a second sub-supporting lateral edge 50122 and a third sub-supporting lateral edge 50123 disposed in parallel, wherein the second sub-supporting lateral edge 50122 is closer to the display unit 503 than the third sub-supporting lateral edge 50123, and the second sub-supporting lateral edge 50122 is directly connected to the main plate portion 5011. There is a gap 5016 between the second sub-supporting lateral edge 50122 and the third sub-supporting lateral edge 50123. When the indicator lamp 5023 is operating, light emitted by the indicator lamp may be output towards the transparent cover plate 504 through the gap 5016, and pass through the transparent cover plate 504 outwards. That is, the gap forms an indicator lamp light-exiting hole. In this cross section view, the second sub-supporting lateral edge and the third sub-supporting lateral edge are separated by the gap 5016. Nevertheless, the second sub-supporting lateral edge and the third sub-supporting lateral edge are connected with each other via a connecting portion in another cross section (such as the fourth sub-supporting lateral edges as shown in FIG. 8).

FIG. 9 shows a front view of a main plate portion 901 with a first through hole 9014. The main plate portion is also provided with a central recess portion for accommodating a display unit, and gaps 9016 on the periphery to allow light emitted by an indicator lamp to pass through.

Figure 11:
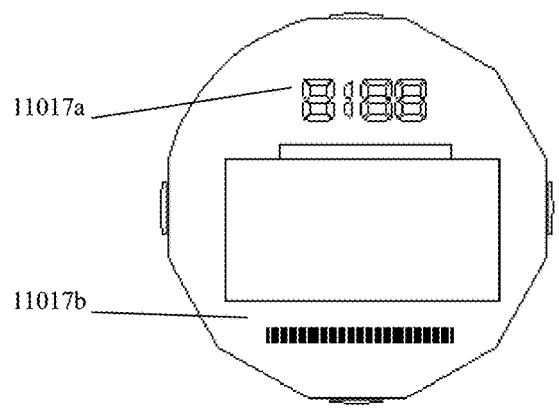
FIG. 11 shows a manner in which an opening is made in the supporting intermediate frame.

In addition to arranging LED lamps in a ring shape on the periphery of the control board corresponding to the region of the supporting lateral edge, the LED lamps may also be arranged on a region of the control board corresponding to some regions of the main plate portion. FIG. 11 shows a manner in which an opening is made in the main plate of the supporting intermediate frame. Opening 11017a and opening 11017b are openings for indicator lamps, i.e., indicator lamp light-exiting holes, for exposing the LED indicator lamps disposed in corresponding positions on the control board. The central rectangular area schematically shows a position for placing the display unit. The display unit may be accordingly have a rectangular display area, and may be used in cooperation with the light filtering layer of FIG. 15 for example. In an embodiment of the present disclosure, the control board may control a set of LED lamps in a position corresponding to the opening 11017a to display a number or time, or control a set of LED lamps in a position corresponding to the opening 11017b to display working intensity or the like through the number of the lights being luminous.

In an embodiment, the transparent cover plate comprises a cover plate body and a light filtering layer disposed at a side of the cover plate body close to the display unit; the light filtering layer comprises a transparent region and a light shielding region disposed to surround the transparent region, and the transparent region is used for transmission of light emitted by the display unit; and the light filtering layer further comprises a translucent region, which is used for transmission of light emitted by the indicator lamp when the indicator lamp is operating and presents a color the same as or close to that of the light shielding region when the indicator lamp is not operating.

Figure 14:
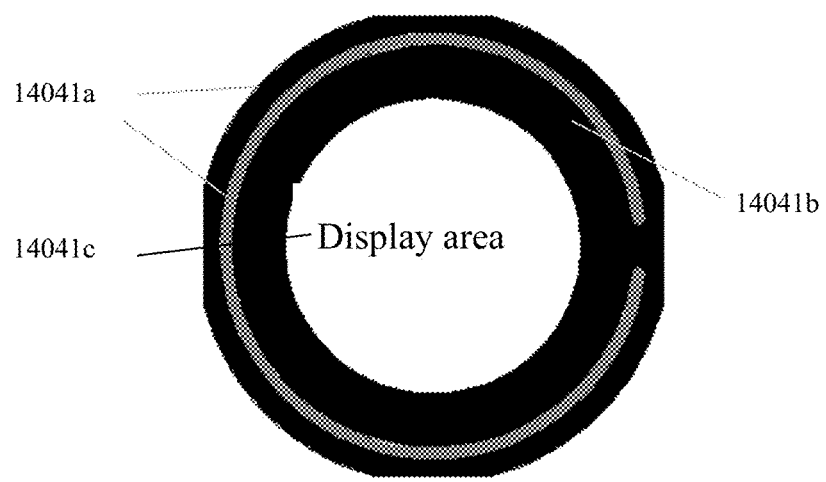
FIG. 14 shows an embodiment of an optical filter.
Figure 15:
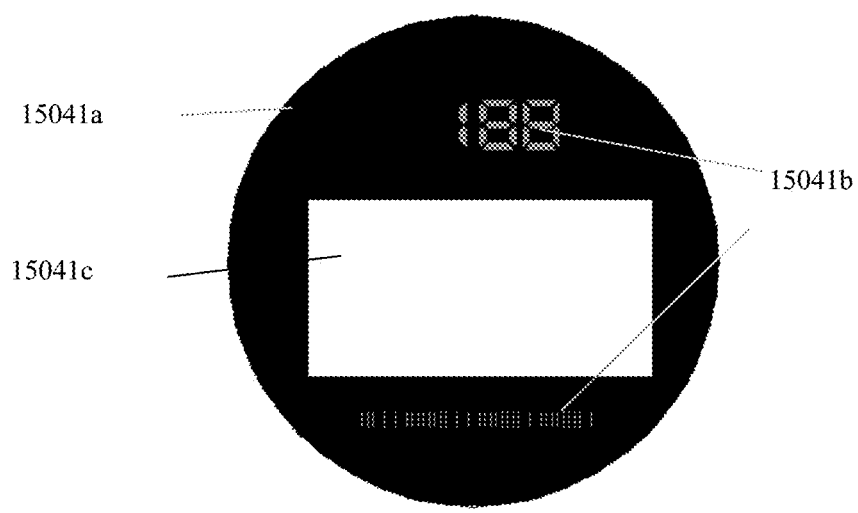
FIG. 15 shows another embodiment of an optical filter.

The transparent cover plate of the display module may comprise a light filtering layer or an optical filter, which has a light shielding region for shielding a non-light-emitting area and a transparent region for exposing the display area of the display unit. As shown in FIG. 1, the transparent cover plate on the front surface of the display unit may comprise an optical filter 1041. The light filtering layer may be a coating layer directly formed on a surface of the cover plate body, or may be a separate optical filter. The optical filter has a light shielding region, which may be formed from a black ink and shield a region which needs not to emit light, to provide the product with a good appearance. A transparent region corresponds to the display unit. FIG. 14 shows an embodiment of a light filtering layer having light shielding regions 14041a and a transparent region 14041c. The transparent region may be a hollow region without any material. The light filtering layer shown in FIG. 14 may be a ring-shaped optical filter. FIG. 15 shows another embodiment of a light filtering layer having a light shielding region 15041a and a transparent region 15041c. It may be used in cooperation with the supporting intermediate frame as shown in FIG. 11.

In an embodiment, the light filtering layer may further comprise a translucent region, which is used for transmission of light emitted by the indicator lamp when the indicator lamp is operating and scatter light rays of the indicator lamp for uniform display, and presents a color the same as or close to that of the light shielding region when the indicator lamp is not operating. The difference between the translucent region and the completely transparent region is that the translucent region itself may have a color, and may allow light passing therethrough to be scattered, such that the light appears more uniform and soft. The translucent region may be a light scattering region. The translucent region may be formed by overlaying a layer of black translucent film on the surface of a white diffusing ink. FIG. 14 shows a translucent region 14041b, and FIG. 15 shows translucent regions 15041b. FIG. 5 shows the light shielding region 5041a, the translucent region 5041b, and the transparent region 5041c of the light filtering layer. The transparent region is used for light emitted by the display unit, and the translucent region is used for light emitted by the indicator lamp. Here, in FIG. 8, the light filtering layer also has the light shielding regions 8041a, the translucent region 8041b, and the transparent region 8041c.

When assembled into the display module, the translucent region presents a color the same as or close to that of the light shielding region when the indicator lamp is not operating. Close colors refer to those which are difficult to distinguish for the user at a normal use distance. In an embodiment, when viewing a normal use distance, the translucent region and the neighboring light shielding region both substantially have a black color, and appear to be integrated as a whole. Thus, a completely black screen may be displayed, appearing a black mirror state, which is more good-looking. When the display module is operating, the display unit in the central area normally displays a startup screen and a working interface, and the indicator lamp region lights up depending on the working condition.

Figure 16:
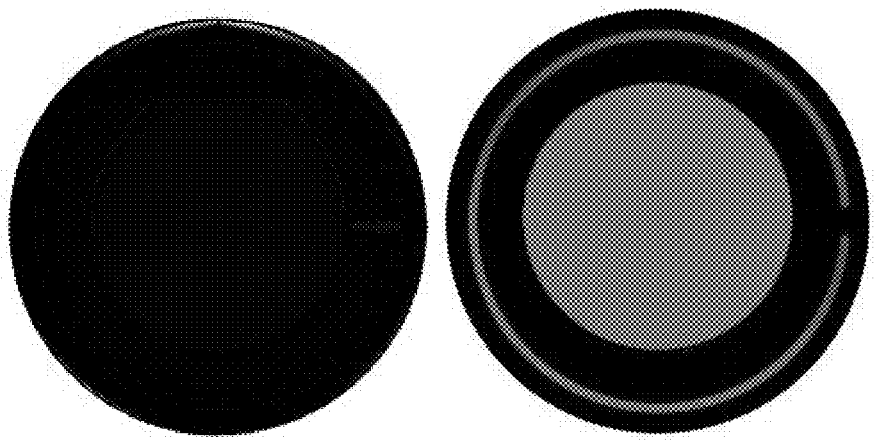
FIG. 16 shows external views of a display module in an embodiment in both an operating state and a non-operating state.

FIG. 16 shows external views of a display module in an embodiment in both an operating state (left) and a non-operating state (right). As can be seen, it displays a pure black appearance in a non-operating state, and in an operating state, the display of the display unit may be viewed from the transparent region, and the lighting up of the indicator lamp is checked from the translucent region. In a non-operating state, the black appearance of the translucent region may be achieved by selecting a grey light-scattering film and stacking a grey cover plate body thereon. The grey cover plate body may be a grey glass.

In an embodiment, the supporting lateral edge comprises a plurality of fourth sub-supporting lateral edges which connect the second sub-supporting lateral edge with the third sub-supporting lateral edge;

the fourth sub-supporting lateral edges extend in directions parallel to an extending surface of the control board; and the fourth sub-supporting lateral edges are disposed close to the control board.

A connecting portion is needed between the third sub-supporting lateral edge and second sub-supporting lateral edge as described previously, such that the third sub-supporting lateral edge may be indirectly connected to the main plate portion. The connecting portion is provided at a position which needs not to transmit light emitted by the indicator lamp, and for example, may be provided between the gaps described previously. Optionally, the connecting portion may be the fourth sub-supporting lateral edge which also provides auxiliary support for the control board at the same time.

The fourth sub-supporting lateral edges function to connect the second and third sub-supporting lateral edges and support the control board. As shown in FIG. 8, the second sub-supporting lateral edge 80122 and the third sub-supporting lateral edge 80123 are connected via the fourth sub-supporting lateral edges 80124. The fourth sub-supporting lateral edges 80124 extend in a direction parallel to the extending plane of the control board 802, and are disposed close to the control board 802. They may function to assist in supporting the control board 802 at the periphery of the display module. As shown in FIG. 8, the fourth sub-supporting lateral edges are disposed at a position on the control board without the indicator lamp, thereby not influencing light emitted by the indicator lamp, and may just effectively support the control board.

Specifically, the fourth sub-supporting lateral edges and the second and third sub-supporting lateral edges may all be formed in one time process.

Specifically, the fourth sub-supporting lateral edges and the first, second and third sub-supporting lateral edges may all be formed in one time process.

The control board of the present disclosure may be not directly attached to the main plate portion of the supporting intermediate frame due to the presence of the sub-supporting lateral edges and/or the supporting portion of the supporting fixing pillar, with a gap remained therebetween. The gap between the control board and the main plate portion may be advantageous for uniform heat dissipation and/or damping of the control board.

The structure of the display module of the present disclosure employs a fixing portion, in particular the supporting fixing pillar, at a side of the supporting intermediate frame away from the display unit, in place of a conventional bolt for fixing. This is not only advantageous for the properties such as damping and sealing of the display module, but also provides great flexibility for the component arrangement and wiring of small-size display modules.

Various electronic components are arranged on the control board in the display module, and achieve different functions respectively. Various functional units, as well as power supply components for powering those functional units and processors for controlling those functional modules are provided on the control board.

Figure 23:
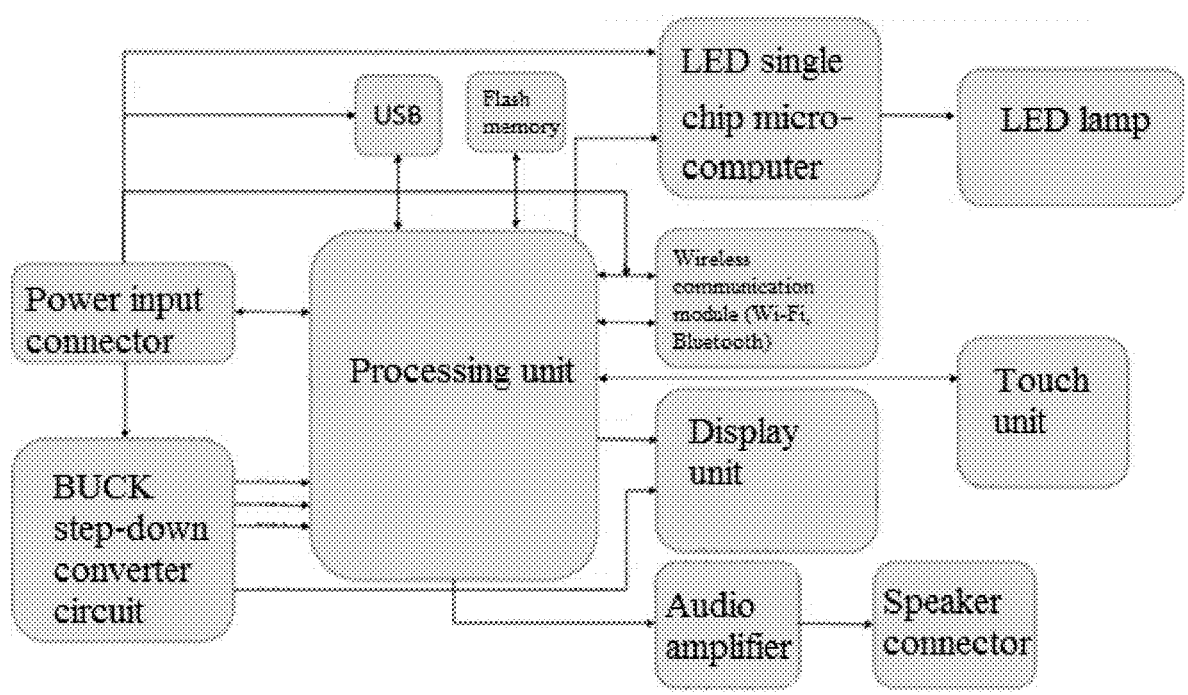
FIG. 23 shows a functional block diagram of an embodiment of the present disclosure.

FIG. 23 shows a functional block diagram of an embodiment of the present disclosure. The display module has a display unit, a wireless communication module, a storage unit such as USB or flash memory, an audio unit (for example, including an audio frequency amplifier and a speaker connector connected thereto), a touch unit, and an LED indicator lamp unit (for example, including an LED single chip microcomputer and an LED lamp connected thereto). The display module has a processing unit for controlling the above modules. The display module also has a power supply component for powering various units.

In the figure, the processing unit may intercommunicate with those functional units or control them, while a power input connector and a Buck step-down converter circuit may provide desired working voltages for the functional units.

Specifically, the power input connector is connected to an external power supply to power the entire display module. It may directly power the processing unit, the USB, the LED single chip microcomputer, the wireless communication module and the like, for example, by providing a voltage of 5 V. It may also output a relatively low voltage with a transformer component such as a BUCK step-down converter circuit. For example, it may provide a voltage of 2.8 V for the display unit, or a voltage of 1.1 V, 1.8 V, 3.3 V or the like for the component in the processing unit. The processing unit may communicate and exchange data with units such as a USB, a flash memory, a Wi-Fi, a Bluetooth and a touch unit. The processing unit may control the display unit, an example of which may be a 2.1 inch LCD display screen. The processing unit may also control the LED single chip microcomputer to control the LED lamp. The processing unit may have an audio processor, which is connected to an audio amplifier and further connected to a speaker connector, for providing a sound signal for a loudspeaker provided externally. The processing unit may be controlled by the touch unit. It should be understood that the functional block diagram is only for the purpose of illustrating a general working principle of the display module, and will not limit the function of the display module of the present disclosure.

The display module of the present disclosure may further comprise another functional module, such as a temperature sensing module, a humidity sensing module, an acceleration sensing module, a gravity sensing module, a gas detection module, and a geographic location positioning module. All of them may be controlled or accessed by the processing unit, and powered by the power supply component.

The present disclosure also provides the component arrangement and wiring and the position design scheme of the position-limiting hole/supporting fixing pillar in the display module.

In an embodiment, the control board comprises a second through hole, and the flexible circuit board passes through the second through hole and is connected to a side of the control board away from the main plate portion; and the control board comprises a control board body and a flexible circuit board connector disposed at a side of the control board body away from the main plate portion, the flexible circuit board connector is disposed adjacent to the second through hole, and the flexible circuit board connector comprises a flexible circuit board connecting terminal;

the second through hole is a strip-shaped through hole, and the flexible circuit board connecting terminal extends in a direction the same as an extending direction of the second through hole; and the second through hole is disposed at an edge of the control board, and the flexible circuit board connector is closer to a center of the control board than the second through hole.

The flexible circuit board connector as a component of the control board may be disposed on the back surface of the control board, at a side away from the main plate portion, for connecting the flexible circuit board. It may have a flexible circuit board connecting terminal such as a connecting finger which allows the port of the flexible circuit board to be plugged and connected. The second through hole may be a strip-shaped through hole to allow the flat flexible circuit board to pass through. The flexible circuit board connecting terminal extends in a direction the same as an extending direction of the second through hole. That is, they are parallel to each other. As such, the flexible circuit board may be plugged into the flexible circuit board connector without twisting after passing through the second through hole. The flexible circuit board connector is a large volume component, and may be disposed close to the center of the control board. With respect to it, the through hole may be further away from the center. Such a manner of component arrangement and wiring is advantageous for the plug connection mounting of the flexible circuit board, and also prevents large bending of the flexible circuit board.

Figure 22:
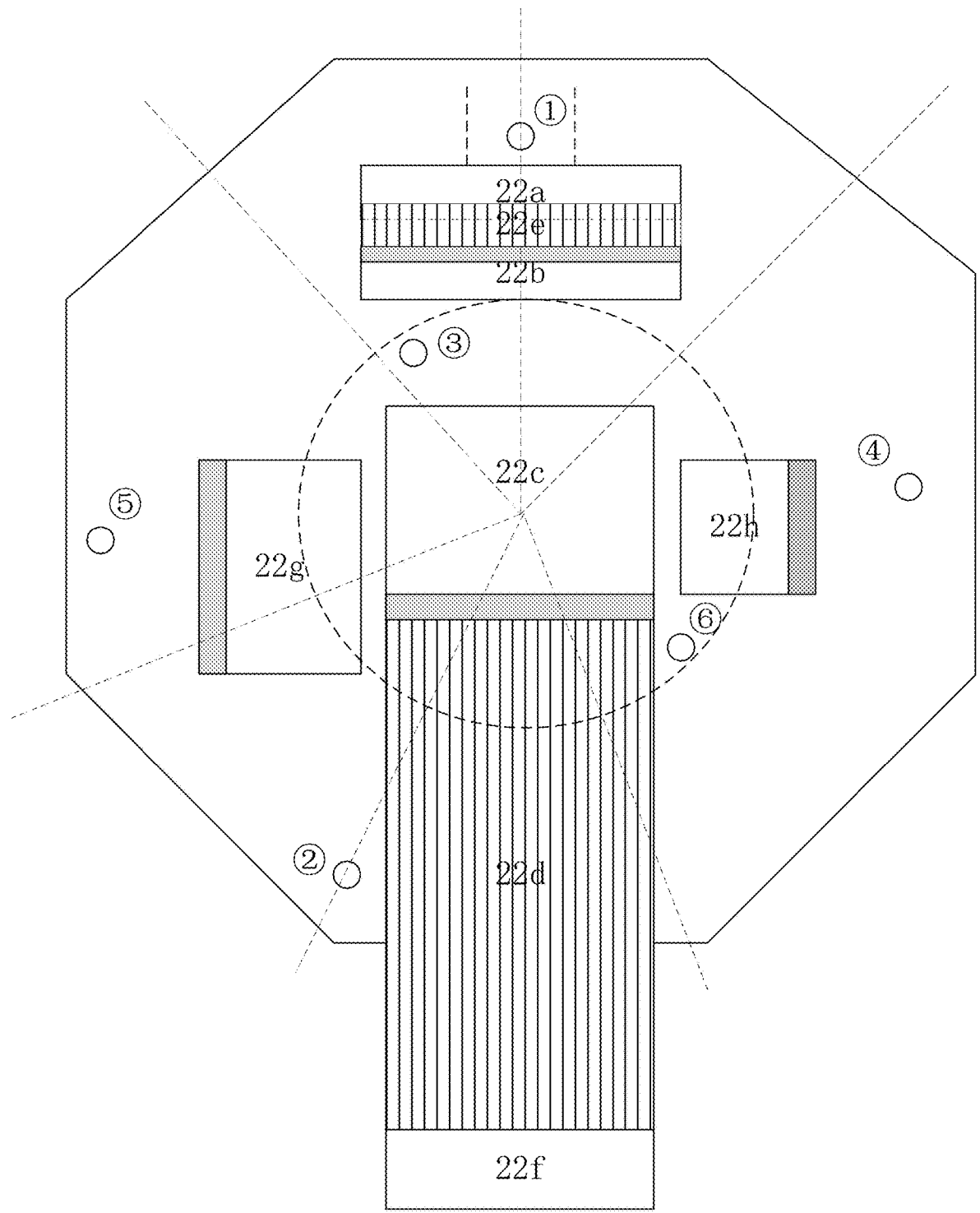
FIG. 22 shows a schematic diagram of the component arrangement and wiring at a side of a control board body away from the main plate portion (i.e., the back surface of the control board).

FIG. 22 shows a schematic diagram of the component arrangement and wiring at a side of a control board body away from the main plate portion (i.e., the back surface of the control board). The figure shows a second strip-shaped through hole 22a and a flexible circuit board connector 22b, which are disposed adjacent to each other and extend in the same direction. The flexible circuit board connector 22b is closer to the center of the control board. The flexible circuit board 22e may be connected to the connecting terminal of the flexible circuit board connector (grey region) on the upper edge of the flexible circuit board connector after passing through the second strip-shaped through hole 22a.

The flexible circuit board is directly led out from the flexible circuit board after it passes through the second through hole, and the space below the led-out flexible circuit board corresponds to the flexible circuit board connector. It is necessary for the flexible cable to avoid dead fold as much as possible. There should be no components below the led-out flexible circuit board to avoid short circuit due to piercing. Therefore, the flexible circuit board connector disposed at a distance of 4 mm±0.5 mm below the second through hole is appropriate.

In an embodiment, the control board body comprises a first position-limiting hole disposed between the second through hole and a first edge of the control board body; and an orthographic projection of a center of the first position-limiting hole on a hole edge of the second through hole close to the first position-limiting hole is located within a middle ⅓ section of an entire length of the hole edge.

In a specific embodiment, the fixing portion comprises a first sub-fixing portion cooperating with the first position-limiting hole for fixing.

The first position-limiting hole may be close to the first edge of the control board body. The first edge is an edge closest to the second through hole, i.e., the upper edge above the second through hole as shown in FIG. 22. The first position-limiting hole is preferably disposed close to the centerline of the main plate portion to increase the bearing capacity at the position near the flexible circuit board connector, and especially increase its reliability in an operating environment of high vibration. ① in FIG. 22 shows the first position-limiting hole, and an orthographic projection of a center of the first position-limiting hole on a hole edge of the second through hole close to the first position-limiting hole is located within a middle ⅓ section of an entire length of the hole edge, such as the location between two dashed lines.

In an embodiment, the control board comprises a touch unit connector disposed at a side of the control board body away from the main plate portion; and when a circle is drawn with a center of the control board body as an origin on a plane in which the touch unit connector is located, and the circle has an area covering ⅑ of an area of the control board, an orthographic projection of the touch unit connector on the control board body has a center inside the circle.

The touch unit connector cannot be too close to the edge, otherwise it is not advantageous for mounting and plugging the touch unit connecting cable. Furthermore, the touch unit connector disposed in the center is more convenient to be supported by the supporting fixing pillar, and its center is preferably disposed within the above reference circle. In FIG. 22, the touch unit connector 22c is located within a reference circle drawn with a dashed line. More preferably, the center of the control board body is located within an orthographic projection of the touch unit connector on the control board body. As such, the touch unit connector not only has a center close to the center of the control board body, but also takes up per se the center of the control board body, such that the structure is more firm.

In an embodiment, the touch unit connector comprises a touch unit connecting terminal which is configured to allow a touch unit connecting cable to extend in a direction away from the flexible circuit board connector.

FIG. 22 shows a touch unit connecting terminal disposed on the lower end of the touch unit connector, indicated in grey. The touch unit connecting cable connected to the touch unit connector will extend downwards away from the upper flexible circuit board connector to avoid spatial conflict or interference between them.

The touch unit connecting cable, the touch unit connector, the flexible circuit board connector, the flexible circuit board, and the second through hole are all substantially on the centerline of the display module in a vertical direction. The touch unit connector is located within a middle ⅓ width region. The touch unit connecting cable extends from the touch unit connector toward a region below. The flexible circuit board connector is located in a region above the touch unit connector. The second through hole is located at a distance of 4 mm±0.5 mm above the flexible circuit board connector.

In an embodiment, the display module comprises a touch unit connected to the touch unit connecting terminal via the touch unit connecting cable;

the control board body comprises a second position-limiting hole which is disposed adjacent to a second edge of the control board, wherein the second edge is located opposite to the first edge;

the second position-limiting hole is disposed adjacent to the touch unit connecting cable;

an orthographic projection of the touch unit connecting cable on the control board does not overlap with the second position-limiting hole; and the fixing portion comprises a second sub-fixing portion cooperating with the second position-limiting hole for fixing.

As shown in FIG. 22, the upper end of the touch unit connecting cable 22d is plugged into the connecting terminal of the touch unit connector, and its lower end is connected to the touch unit 22f.

The touch unit connecting cable is substantially located on the centerline of the display module below the display unit, which is easy for the user to operate the touch unit on the proximal end. The touch unit is a component suitable for single hand operation of the user, and should be ergonomically easy to operate and good-looking. When the touch unit is disposed right below the centerline of the display unit, it is both good-looking and convenient for the user to operate on the proximal end when viewing the image displayed by the display unit. As described above, the touch unit connector is also substantially on the centerline of the display module in a vertical direction. When mounting, it is necessary to plug the touch unit connecting cable into the touch unit connector. Because the male terminal for plugging the cable is a hard terminal, and there is usually a blocking wall on the outer periphery of the supporting intermediate frame, it is necessary to preserve twice length of the male terminal in the direction of plugging the cable to ensure that the plugging will not be obstructed. Therefore, the touch unit connector is preferably located within a middle ⅓ width region. The components of the touch unit connecting cable and the flexible circuit board should be located in opposite directions of the touch unit connector. That is, when the touch unit connecting cable extends downwards, the flexible circuit board through hole and the flexible circuit board connector should be disposed above the touch unit connector. The reason is as follows: the flexible circuit board is the main heat generating component, and should not be overlapped with other cables; the touch unit connecting cable is a flexible cable, and should be prevented from being overlapped with hard components such as the flexible circuit board connector; furthermore, the crossing and overlapping of various cables may also result in signal interference.

Specifically, the material used for the touch unit connecting cable is typically a PET sheet, which is different from the materials for a mains cord or the like. The mains cord is typically a copper wire coated with an insulating layer outside, and the material for the insulating layer is PVC (polyvinyl chloride), which has good resistance to bending, twisting or scratching. However, if the touch unit connecting cable is above a protruding point, it will be easily pierced, resulting in abnormal circuit. Therefore, the fixing portion near the touch unit connecting cable should be kept away from the wiring position of the touch unit connecting cable. Therefore, the position of the position-limiting hole at a position near a second edge (the lower edge in FIG. 22) of the control board may be designed to be not centrally symmetrical with the first position-limiting hole near the first edge about the center of the control board, wherein the second edge is located opposite to the first edge.

As indicated by ② in FIG. 22, orthographic projections of the second position-limiting hole and the touch unit connecting cable on the control board do not overlap with each other.

In an embodiment, the control board comprises a power input connector disposed at a side of the control board body away from the main plate portion;
  the power input connector is located at one side of a surface of the control board body divided by an orthographic projection of an axis of the touch unit connecting cable on the surface of the control board body; and
  the power input connector comprises a power input connecting terminal which is configured such that a power connecting cable extends towards an edge of the control board body in a direction at an angle other than 0° and 180° with respect to an extending direction of the touch unit connecting cable.

As described above, horizontal plugged cable are suitable for connectors other than the flexible circuit board connector and the touch unit connector, such as a power input connector, to avoid interference with the flexible circuit board and the touch unit connecting cable. The power input connector is used to connect with an external power supply to power the display module. Basically, the power input connecting terminal of the power input connector only needs to be such that the power connecting cable extends in a direction different from the extending direction of the touch unit connecting cable, i.e., at an angle other than 0° and 180°. Preferably, the power connecting cable extends in a direction perpendicular to the extending direction of the touch unit connecting cable. The power input connector is located at one side of a surface of the control board body divided by an orthographic projection of an axis of the touch unit connecting cable on the surface of the control board body. That is, orthographic projections of the power input connector and the touch unit connecting cable on the surface of the control board body do not overlap with each other.

As shown in FIG. 22, the power input connector 22g is disposed at the left side, and after the power input connecting terminal disposed on its left side indicated in grey is connected to the power connecting cable, the power connecting cable extends in a direction substantially perpendicular to an extending direction of the touch unit connecting cable.

A signal interaction connector may be further mounted on the control board for transmitting a signal between the control board of the display module and the control board of the complete machine. The signal interaction connector may be disposed to be integrated with or in parallel to the power input connector, and the signal interaction connecting cable may be disposed in parallel to the power input connecting cable.

In an embodiment, the control board comprises a speaker connector disposed at a side of the control board body away from the main plate portion;
  the speaker connector is located at the other side of the surface of the control board body divided by the orthographic projection of the axis of the touch unit connecting cable on the surface of the control board body, other than the side at which the power input connector is located; and
  the speaker connector comprises a speaker connecting terminal which is configured such that the speaker connecting cable extends towards the edge of the control board body in a direction at an angle other than 0° and 180° with respect to the extending direction of the touch unit connecting cable.

The speaker connector is used for connecting with an external speaker or loudspeaker, such that the control board may also provide a voice prompt for the user through the display module. The component arrangement rule which it follows is similar to that for the power input connector. Nevertheless, because both the speaker connector and the power input connector are components having a relatively large size, the speaker connector is preferably disposed at a side opposite to the power input connector.

In FIG. 22, the speaker connector 22h is disposed at a side opposite to the power connector 22g, i.e., at the right side. Also, a speaker connecting terminal indicated in grey is configured such that the speaker connecting cable extends towards the edge of the control board body in a direction substantially perpendicular to the extending direction of the touch unit connecting cable. Orthographic projections of the speaker connector and the touch unit connecting cable on the surface of the control board body do not overlap with each other, either.

The power connector and the speaker connector may be disposed at two sides of the centerline respectively at a horizontal distance between 0.5 mm and 5 mm from the touch unit connecting cable. They may be close to the center as much as possible, for example, at a distance less than 5 mm. Nevertheless, considering the possible minimum distance of the closest pin from the touch unit connecting cable under the space requirement available for arranging a component, it is necessary to reserve a distance of at least 0.5 mm.

In an embodiment, the power input connecting terminal and the speaker connecting terminal are configured such that a power input connecting cable and a speaker connecting cable extend in opposite directions; and
  the power input connecting terminal is configured such that the power input connecting cable has an extending direction perpendicular to that of the touch unit connecting cable.

Such a manner of component arrangement and wiring enables the minimum interference between various components, which is advantageous for plugging and unplugging of various connecting cables, and suitable for the designed cooperation of the position-limiting hole and the supporting fixing pillar of the present disclosure to achieve firm and anti-vibration assembling of the display module.

FIG. 22 shows a configuration where the power input connecting cable and the speaker connecting cable extend in opposite directions both of which are perpendicular to the extending direction of the touch unit connecting cable.

Not being bound to any theory, the inventors have found that horizontal plug wires are suitable for other connectors such as a power input connector and a speaker connector. Because of the presence of the intermediate frame blocking wall in the module outline, on the premise of a small size module with a maximum outline of not more than 100 mm, a relatively long space having a travel distance for plugging the cable needs to be preserved as much as possible in the plugging direction, which is convenient for production. If the terminal is shifted from the center to the edge position by ⅓ or more, a difficulty that the user's hand is so large that it is difficult to reach the terminal may occur. In order to ensure smooth and unblocked plugging, in the case that the positions of the flexible circuit board and the touch unit connector have been determined, the optimum positions for setting other connectors are the left and right sides of the touch unit connecting cable and the touch unit connector while being close to the center as much as possible. The travel distance for plugging the cable has the most sufficient space, and the flexible circuit board, the touch unit connecting cable, the power input, and the speaker plug wire do not cross and do not interfere with each other.

Figure 10:
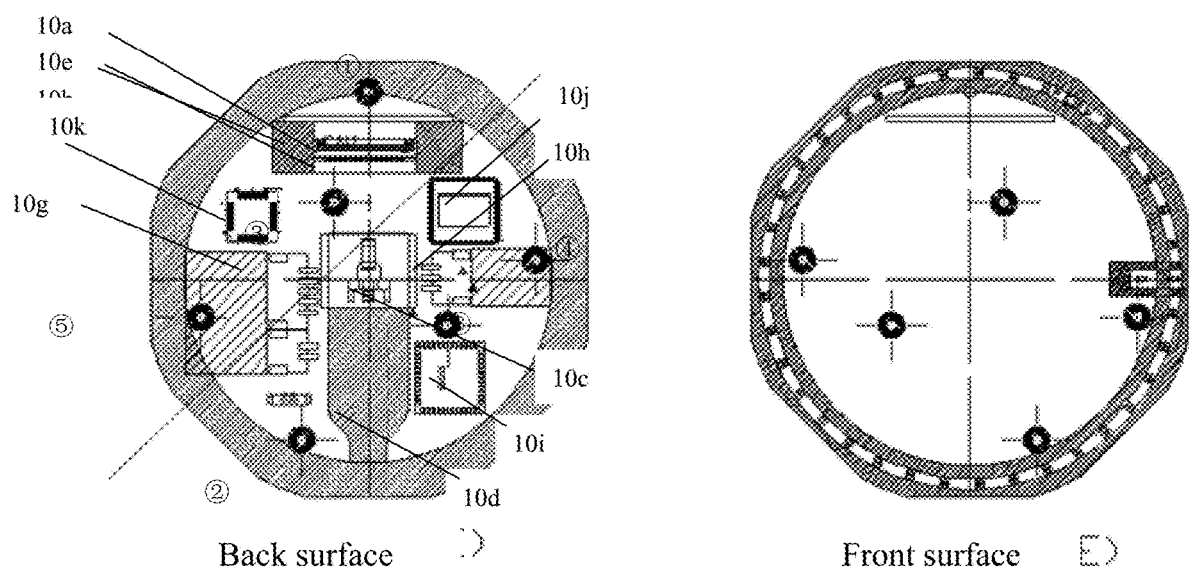
FIG. 10 shows schematic diagrams of arrangements of position-limiting holes on the front surface and back surface of the control board according to an embodiment of the present disclosure.

As shown in the left view of FIG. 10, the power input connector 10g and the speaker connector 10h are disposed at two sides of the centerline respectively, and openings for connecting cables are outward to the left and right sides respectively. They have a horizontal distance of less than 5 mm from the touch unit connecting cable 10d. For example, a Wi-Fi and/or Bluetooth component 10i may also be provided at a lateral side of the touch unit connecting cable. Other regions of the control board may also comprise, for example, a microcontroller unit MCU 10j, a touch control processor 10k, and the like. For example, MCU may be disposed between the speaker connector and the flexible circuit board connector. For example, the touch control processor may be disposed between the power connector and the flexible circuit board connector.

In an embodiment, the control board body further comprises a third position-limiting hole disposed between the flexible circuit board connector and the touch unit connector; wherein
  the third position-limiting hole does not intersect a connecting line passing through a center of an orthographic projection of the touch unit connector on the control board body and a center of an orthographic projection of the flexible circuit board on the control board body; and
  the fixing portion comprises a third sub-fixing portion cooperating with the third position-limiting hole for fixing.

The third position-limiting hole is used for providing support at the central part of the control board body. It is disposed between the flexible circuit board connector and the touch unit connector, and may provide support for both connectors. It does not overlap with the straight line in which the connecting line passes through the centers of both connectors. That is, it is not disposed on the straight line, but at a side thereof. This is because the first position-limiting hole has been preferably provided on the centerline at the edge. In FIG. 22, the third position-limiting hole ③ is not disposed on the centerline. The first position-limiting hole is already provided on the centerline. Therefore, the third position-limiting hole may be further away from the straight line, in which the above-mentioned connecting line lies, than the first position-limiting hole, and therefore may provide more evenly distributed support at the central part of the control board body.

In an embodiment, the control board comprises a processing unit disposed at a side of the control board body away from the main plate portion.

That is, the control board may further comprise a processing unit disposed on its back surface. The processing unit may be a processor. Since the processing unit does not need any external cable, no connecting terminal for an external cable is provided, and the processing unit may be arranged at any position which does not conflict and interfere with the components and wiring as described previously.

In an embodiment, the control board further comprises one or more selected from the group consisting of a Wi-Fi module, a Bluetooth module, a temperature sensing module, a humidity sensing module, an acceleration sensing module, a gravity sensing module, a gas detection module, and a geographic location positioning module. All those modules may be disposed at a side of the control board body away from the main plate portion, and provide more functions for the display module.

In an embodiment, the control board body comprises a fourth position-limiting hole and fifth position-limiting hole, both of which are disposed close to edges of the control board body; wherein the fourth position-limiting hole is located on a connecting line traveling clockwise from the first position-limiting hole to the second position-limiting hole along the edges of the control board body; and the fifth position-limiting hole is located on a connecting line traveling counterclockwise from the first position-limiting hole to the second position-limiting hole along the edges of the control board body;
  the fourth position-limiting hole and the fifth position-limiting hole are configured such that when drawing connecting lines from the first, second, fourth and fifth position-limiting holes to a center of the control board, an angle formed between each two connecting lines is greater than or equal to 45°; and
  the fixing portion comprises a fourth sub-fixing portion cooperating with the fourth position-limiting hole for fixing; and the fixing portion comprises a fifth sub-fixing portion cooperating with the fifth position-limiting hole for fixing.

After providing two position-limiting holes, i.e., the first position-limiting hole and the second position-limiting hole, close to the edge and one position-limiting hole, i.e., the third position-limiting hole, close to the center, more position-limiting holes may be further provided at the positions which are still relatively weak, and more fixing portions may be further provided accordingly, to increase the stability.

As shown in FIG. 22, a fourth position-limiting hole and a fifth position-limiting hole may be further provided respectively at the edge from the first position-limiting hole to the second position-limiting hole in a clockwise direction and the edge from the first position-limiting hole to the second position-limiting hole in a counterclockwise direction, and they are both kept away from the first and second position-limiting holes at a sufficiently large circumferential angle, thereby more effectively reinforcing the weak portion. Specifically, they are located at a position kept away from the first and second position-limiting holes in clockwise and counterclockwise directions at a circumferential angle of more than 45°. In FIG. 22, radial dashed lines at both sides of the first and second position-limiting holes each show a range of 45° circumferential angle, and the fourth and fifth position-limiting holes ④ and ⑤ are located outside such ranges. Thus, the fourth position-limiting hole and the fifth position-limiting hole are configured such that when drawing connecting lines from the first, second, fourth and fifth position-limiting holes to a center of the control board, an angle formed between each two connecting lines is greater than or equal to 45°.

As such, four position-limiting holes are arranged relatively evenly at the edge of the control board, such that there is no obvious weak portion.

In an embodiment, the control board body comprises a sixth position-limiting hole, wherein the sixth position-limiting hole and the third position-limiting hole are respectively located at two sides of the straight line in which the connecting line passes through the center of the orthographic projection of the touch unit connector on the control board body and the center of the orthographic projection of the flexible circuit board on the control board body;

a minimum distance between the sixth position-limiting hole and an edge of the control board body is greater than a minimum distance between any one of the first, second, fourth and fifth position-limiting holes and an edge of the control board body; and the fixing portion comprises a sixth sub-fixing portion cooperating with the sixth position-limiting hole for fixing.

The sixth position-limiting hole is also used to support the central part of the control board body. Therefore, it is further away from the edge, i.e., closer to the center, than the first, second, fourth, and fifth position-limiting holes. In addition, the sixth position-limiting hole and the third position-limiting hole are disposed at two sides of the centerline respectively, and therefore may provide more evenly distributed support for the central part of the control board body.

In an embodiment, the control board body comprises a fourth position-limiting hole, a fifth position-limiting hole and a sixth position-limiting hole, wherein the first and the fourth position-limiting holes, the second and the fifth position-limiting holes, and the third and the sixth position-limiting holes are respectively arranged axially symmetrically with respect to an axis passing through the center of the control board body; and the fixing portion comprises a fourth sub-fixing portion cooperating with the fourth position-limiting hole for fixing; the fixing portion comprises a fifth sub-fixing portion cooperating with the fifth position-limiting hole for fixing; and the fixing portion comprises a sixth sub-fixing portion cooperating with the sixth position-limiting hole for fixing.

As described previously, after determining the positions of the first, second and third position-limiting holes, a symmetry axis passing through the center of the control board body may be provided, and the positions of the fourth, fifth and sixth position-limiting holes may be determined symmetrically with respect to the axis. The axis may be a straight line at an angle of 45° with respect to a straight line passing through the center of the control board body and the center of the first position-limiting hole, or may also be a straight line at another angle with respect to the straight line. The practical symmetrical positions may have some error, and for example, may have a deviation from ideal symmetrical positions in both the radial direction and the circumferential direction with respect to the center of the control board body, for example, a deviation of 20% or less, and preferably a deviation of 10% or less.

Such a manner of component arrangement and wiring and position-limiting hole arrangement is particularly advantageous. The arrangement of the first to sixth position-limiting holes according to the previous manner will not influence the component arrangement and wiring, can provide sufficient support for the control board at both the edge and the center at the same time, and contribute to reinforcing various connectors and terminals.

FIG. 10 shows schematic diagrams of arrangements of position-limiting holes on the front surface and back surface of the control board according to an embodiment of the present disclosure. The control board has a substantially octagon outer periphery, and the peripheral shaded region represents a portion in contact with the peripheral supporting scaffold of the supporting intermediate frame. No position-limiting hole is provided in this portion.

The second through hole 10a, the flexible circuit board connector 10b, the touch unit connector 10c, the touch unit connecting cable 10d and the flexible circuit board 10e are all on the vertical center line of the display module. The touch unit connector 10c is located within a middle ⅓ width region, and is shown to be located at the midpoint in the figure. The touch unit connecting cable 10d extends toward the lower region from the touch unit connector 10c. The flexible circuit board connector 10b is located within a region above the touch unit connector, and the second through hole 10a is above the flexible circuit board connector 10b, for example, at a distance of 4 mm±0.5 mm.

Here, a first position-limiting hole ① is provided above the second through hole 10a, and more preferably on the centerline, as the fixing and supporting position for the upper edge. A second position-limiting hole ② is provided below the touch unit connector 10c and outside the touch unit connecting cable 10d. From the design principle of central symmetry, the second position-limiting hole at the lower edge should be disposed at a position which is centrally symmetric with the first position-limiting hole, i.e., at the lower end of the centerline. However, the touch unit connecting cable is a flexible flat cable because it is not surrounded by a rubber sheath. If a position-limiting hole is provided in the extending path of the touch unit connecting cable, a protruding fixing head will be formed at a side of the corresponding position of the control board away from the main plate portion (i.e., a side towards the touch unit connecting cable), which will influence the touch unit connecting cable, thereby affecting the touch stability. Therefore, the designed position-limiting hole needs to stay away from the touch unit connecting cable, so that the position for the position-limiting point ② is selected at the left or right side close to the plate edge near the touch unit connecting cable. The position-limiting point ② in the figure is selected to be at the left side. Furthermore, a third position-limiting hole ③ is provided between the flexible circuit board connector 10b and the touch unit connector 10c as a middle position-limiting hole. Here, the second position-limiting hole ② and the third position-limiting hole ③ are at the same side of the centerline, i.e., the left side in the figure. When they are at the same side, the other three position-limiting holes may be easily provided by means of the 45° oblique line described later, and as described below, and they may provide stable support for other connectors at two sides such as the power input connector 10g and the speaker connector 10h.

For example, as shown in FIG. 10, the fourth, fifth and sixth position-limiting holes ④, ⑤, ⑥ are provided at positions symmetrical with those of the first, second and third position-limiting holes respectively, with a line from the bottom left to the top right at an angle of 45° with respect to the centerline in the downward direction (the dashed line in the figure) as a symmetric axis.

The right view of FIG. 10 shows the front surface of the control board accordingly.

As such, the first position-limiting hole may mainly fix the upper edge, the second position-limiting hole may mainly fix the lower edge, and the fourth and fifth position-limiting holes may fix the right and left edges accordingly. The third and sixth position-limiting holes are used for fixing the middle part. This satisfies the design concept of the present disclosure where there are 3-4 supporting fixing pillars arranged at the peripheral area of the main plate portion and 1-2 supporting fixing pillars arranged at the middle area of the main plate portion.

Such a six-point position-limiting hole arrangement is particularly adaptive for the previously described component layout having the flexible circuit board connector and the touch unit connector disposed on the centerline and the power input connector and the speaker connector as well as the Wi-Fi connector disposed at two sides. The power input connector disposed at the left side is supported by the sites of the second, third and fifth position-limiting holes on the periphery. The speaker connector disposed at the right side is supported by the sites of the fourth and sixth position-limiting holes. They, as well as the accessories of the flexible circuit board connector and the touch unit connector, all are supported by at least two sites of position-limiting holes, increasing the stability. For example, near the Wi-Fi component, there is at least one site of position-limiting hole for providing support. The third position-limiting hole is disposed in the middle area of the top left portion, and provides support in the middle of the flexible circuit board connector, the power input connector and the touch unit connector. The sixth position-limiting hole is disposed in the central area of the bottom right portion, and provides support in the middle of the touch unit connecting cable, the speaker connector and the Wi-Fi. Preferably, the third position-limiting hole is selected to be disposed at the same side of the centerline as the larger power input connector to provide stronger support.

In an embodiment, the control board has a shape selected from the group consisting of circle, ellipse and N-sided polygon, wherein N is greater than or equal to 4. Such a control board is suitable for a display module with a regular outline, which is advantageous for a good-looking appearance, and is symmetrical, which is convenient for the design and processing of the component arrangement and wiring. More preferably, octagon may be used. For the same diameter of the circumcircle, it is easier to be processed than a control board having a shape of circle, ellipse and a polygon with more sides, and provides more area for component arrangement than a control board having a shape of tetragon or hexagon.

For the convenience of cooperated assembling of the control board and the back surface of the supporting intermediate frame, the supporting lateral edge of the main plate portion may have a position-limiting inner periphery which has a shape corresponding to the shape of the control board. For example, for the above octagon control board, the position-limiting inner periphery may be designed to be substantially octagon.

In an embodiment, a maximum length of a line segment which is taken on an extending surface of the control board through a center point of the control board is less than or equal to 20 cm.

For example, if the control board is circular, the control board may have a radius less than or equal to 100 mm. Specifically, the fixing manner and manner of component arrangement and wiring in the present disclosure are particularly suitable for a small size display module.

In an embodiment, 3-4 of the supporting fixing pillars are arranged at the peripheral area of the main plate portion, at a distance less than ¼ plate width from the edge of the main plate portion, and 1-2 of the supporting fixing pillars are arranged at the central area of the main plate portion, at a distance less than ¼ plate width from the centroid of the main plate portion. Position-limiting holes are arranged at corresponding positions of the control board. The plate width is a distance at which a line passing through the centroid and a supporting fixing pillar travels between the edges of the plate. For example, for a circular plate, the plate width is its diameter. In other words, 3-4 supporting fixing sites at a position close to the edge may ensure overall uniformity and firmness. More preferably, 4 supporting fixing sites disposed close to the edge ensures firm support. Adding 1-2 supporting fixing sites at a position close to the center and centroid allows the control board to have no large area suspending, thereby avoiding that partial unfixed region quickly deforms under high temperature and high intensity vibration to result in failure. Providing supporting fixing sites near both the edge and the center may allow them to be distributed evenly throughout the control board, resulting in more uniform stress distribution. In an embodiment, in the control board, for any connector or interface for plugging external cable, at least one position-limiting hole is provided within a distance range of 5-10 mm. That is, position-limiting holes are provided near those components with an interface, such that those components are stabilized by the supporting fixing pillars accordingly. Generally, in the mounting operation and subsequent use, an operation of plugging and unplugging a cable is required for the connectors and the external plug wire interfaces. When position-limiting holes are provided near them, corresponding supporting fixing pillars may withstand the damage to the interface by the local stress generated in the operations such as plugging and unplugging the cable vigorously and pressing and fitting the piano cover. Within the above preferred distance range, those connectors or interfaces are provided with stable supporting and fixing, while their mounting and cable connection are not affected.

In an embodiment, the display unit has a shape selected from the group consisting of circle, ellipse and N-sided polygon, wherein N is greater than or equal to 4.

Similar to the control board, the display unit may also have the above preferred shape for the convenience of processing, mounting and sufficient utilization of space.

In an embodiment, the front surface of the supporting intermediate frame is prepared from a replaceable mold insert. The insert is a removable part of the mold, and is replaceable for different product requirements to produce different shapes. Thus, supporting intermediate frames with the same periphery shape may be used for embedding display units with different shapes. For example, a type of universal circular or rectangular supporting intermediate frame may be fabricated, wherein the front surface is prepared with different inserts to obtain different display unit embedding portions, and thus display units of different sizes and shapes may be used instead.

In use, the display module of the present disclosure will be mounted into a complete machine of the electric device. In an embodiment, a fastener is provided at the periphery of the supporting intermediate frame. As shown in FIG. 2, fasteners 2015 may easily fasten the back surface of the supporting intermediate frame to the complete machine of the electric device. In another embodiment, the blocking wall of the supporting intermediate frame may be coated with a back adhesive to adhere the display module to the complete machine. As compared to the adhering, the fastener has an advantage of facilitating quick mounting.

The position of the fastener may be further protruding from the supporting lateral edge, and distributed at the periphery of the supporting intermediate frame. In an example, the fastener may be further protruding from the first sub-supporting lateral edge. In some examples, the fastener and the first sub-supporting lateral edge form an integrated structure. The number of the fasteners may be selected depending on particular condition for fastening to the complete machine. The number is preferably 2-6, and more preferably 4. Preferably, 4 fasteners are evenly distributed at the circumference, and may provide relatively firm binding with the complete machine and will not easily drop out.

In an embodiment, a foam adhesive is provided at the periphery of the supporting intermediate frame. The foam adhesive may have a damping function, such that the vibration delivered from the complete machine is attenuated, thereby further increasing the reliability of the display module. It is also possible to not use any fastener, but only use a foam adhesive to adhere the display module to the complete machine. It is also possible to apply a back adhesive on the most convex portion (for example, the supporting lateral edge) on the back surface of the display module to adhere the display module to the complete machine.

In an embodiment, the display unit is a liquid crystal display module (LCM). Other types of display units may also be selected.

In an embodiment, the outline of the display module is a circle with a diameter less than 200 mm, more preferably a circle with a diameter less than 100 mm, and even more preferably a circle with a diameter less than 90 mm. Such a small size display module is particularly suitable for utilizing the embodiment of the present disclosure.

The present disclosure also provides a method for manufacturing the display module as described above, wherein the control board is assembled into the supporting intermediate frame by steps of:
  providing a non-hot-pressed supporting intermediate frame, wherein a hot melting plastic rod is provided on a supporting portion of a supporting fixing pillar, wherein the hot melting plastic rod has a height greater than that of a position-limiting hole;
  passing the hot melting plastic rod through the position-limiting hole, so that a side of the control board comes into contact with the supporting portion;
  heating and pressing a portion of the hot melting plastic rod protruding from the position-limiting hole with a hot melting press head to deform the portion into the fixing head, which is in contact with a side of the control board away from the main plate portion; and
  cooling and solidifying the fixing head.

Figure 17:
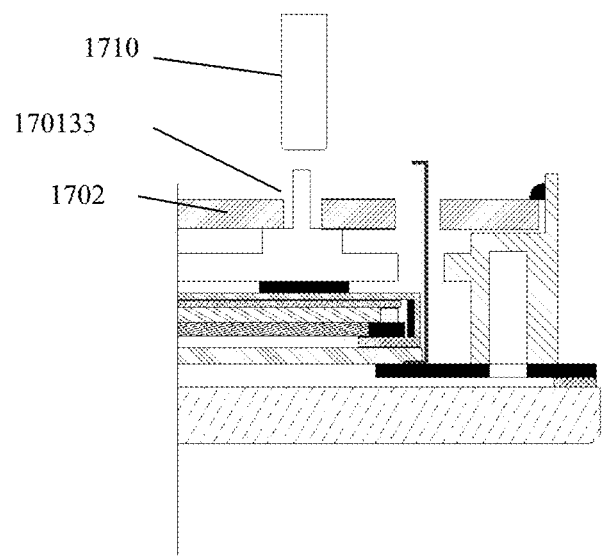
FIG. 17 and FIG. 18 schematically show a hot-pressing process.
Figure 18:
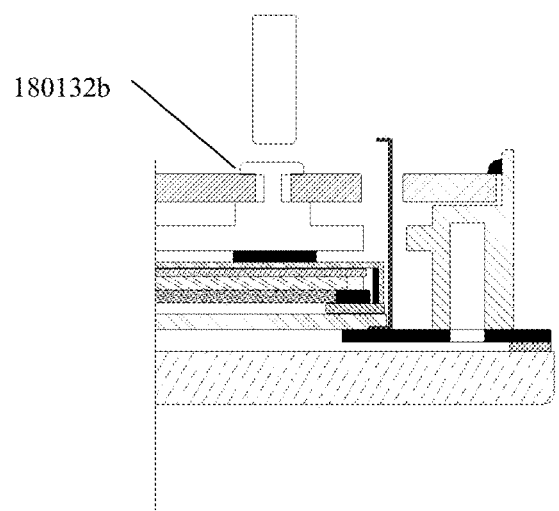

FIG. 17 and FIG. 18 schematically show a hot-pressing process. Here, a fixing head 180132*b* is formed by hot pressing a hot melting plastic rod 170133 with a hot melt device. Specifically, the hot melting plastic rod 170133 is passed through a position-limiting hole in a control board 1702, placed in a hot melt and press fit device, and fixed with a jig to ensure that the component is covered by the jig, with only the circular hole region of the position-limiting pillar exposed. The diameter of the hot melting plastic rod is designed to be the minimum diameter of 1.2 mm which may be made by using a conventional non-high precision mold for plastic, and the height thereof is configured to be higher than the back surface of the control board by 1 mm. A customized hot melting press head 1710 aligned with the hot melting plastic rod, and has a diameter of about 2 mm slightly greater than that of the hot melting plastic rod. Driven by a servo motor, the position precision for the hot pressing may reach ±0.01 mm. By controlling a plurality of hot press heads to move and hot press the hot melting plastic rod, the material at the top end of the plastic position-limiting pillar is melted and shortened in height at elevated temperature, finally presenting the "round-cake-shaped" fixing head 180132*b* with a diameter of about 2 mm as shown in FIG. 18, pressed against the control board. The fixing head cooperates with the supporting portion of the supporting fixing pillar below the control board to ensure that the control board will not deform in the vertical direction.

The difference in height between the hot melting plastic rod and the position-limiting hole may be appropriately selected, such that a fixing head, which is sufficient for covering the position-limiting hole but not too large and too thick, may be formed after hot melting.

The hot melting and pressing method of the present disclosure may conveniently fix the control board to the main plate portion of the supporting intermediate frame.

The display module of the present disclosure may be used to be mounted into an electric device compete machine. In an embodiment, the present disclosure provides an electric device comprising the display module. As described above, the display module may be mounted into the complete machine by fastening or adhering.

In a preferred embodiment, the electric device is a household appliance comprising a motor. In operation, the household appliance comprising a motor is under a situation of high temperature and vigorous vibration. The display module of the present disclosure may effectively reduce the damage and failure in this situation.

In a more preferred embodiment, the household appliance comprising a motor is a household cleaning appliance. In a more preferred embodiment, the household cleaning appliance is a hand-held vacuum cleaner, for example. The touch slide bar in some embodiments of the present disclosure is particularly suitable for a single hand operation during the use of a household cleaning appliance.

EXAMPLES

The display module was assembled according to the structure in FIG. 1. The display module was prepared by using the parameters in the aforementioned preferred embodiment.

The display module as assembled by the following steps.
  1) A display module 103 was fixed to the front surface of a supporting intermediate frame 101 by sticking a double side foam adhesive tape onto the back surface of the display module, wherein an FPC connected to the display module protruded from an FPC through hole in the supporting intermediate frame.

2) A ring-shaped optical filter 1041 was adhered to the front surface of the supporting intermediate frame, such that a display portion of the display module was aligned with an opening portion at the center of the optical filter and was not blocked, and a translucent region was aligned with the ring-shaped openings in the supporting intermediate frame to ensure the output and uniform scattering of light emitted by an indicator lamp.

3) A black double side adhesive tape 1043 was adhered to a grey glass cover plate 1042 at the periphery with a width of 3 mm in advance, and then the grey glass cover plate was adhered to the front surface of the optical filter of the module.

4) Position-limiting holes in an MCU board 102 were placed on hot melting plastic rods of supporting fixing pillars on the back surface of the supporting intermediate frame of the module with positions aligned, and the hot melting plastic rods passed through the position-limiting holes in the MCU board. The FPC was passed through an FPC through hole in the MCU board to protrude toward the back surface.

5) The module was placed into a hot press jig device, the hot melting plastic rods were pressed by a hot press head to form fixing heads, so that the MCU was clamped between the fixing heads and the supporting portions to fix the supporting intermediate frame.

6) The module was placed on a glue dispensing jig to apply glue in a gap between the edges of the MCU board and the supporting intermediate frame.

7) A protection film 1044 was attached to the front face of the module.

8) A touch slide bar 106 is connected to a touch unit connector on the back surface of the MCU board of the module by plugging, and the FPC was connected to an FPC connector on the back surface of the MCU board by plugging. Here, the wiring manner of FIG. 10 was employed on the MCU board. The MCU board was assembled with the supporting intermediate frame in the manner of FIG. 17-FIG. 18.

Figure 19:
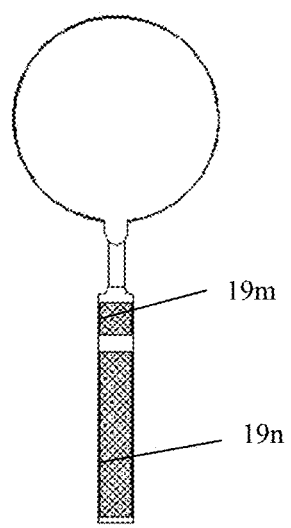
FIG. 19 schematically shows a touch slide bar.
Figure 20:
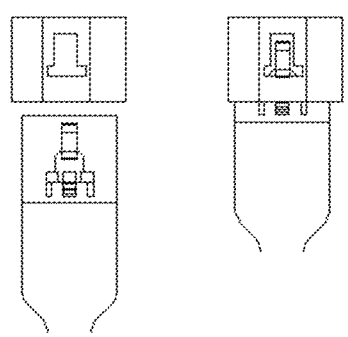
FIG. 20 shows the connection between a distal interface of the touch slide bar and a touch unit connector.

FIG. 19 schematically shows a touch slide bar. 19*m* represents a touch button, which may perform operations such as turning on or off and selecting. 19*n* represents a touch slide bar portion, which may perform operations such as adjustments of working power and light brightness and menu switching by sliding it upwards and downwards by hand. FIG. 20 shows the connection between a distal interface of the touch unit connecting cable and a touch unit connector. The distal interface of the touch unit connecting cable is a hard male terminal. Therefore, the touch unit connector needs to be disposed in the middle ⅓ region to leave at least twice the length of the male terminal for the convenience of mounting.

Figure 21:
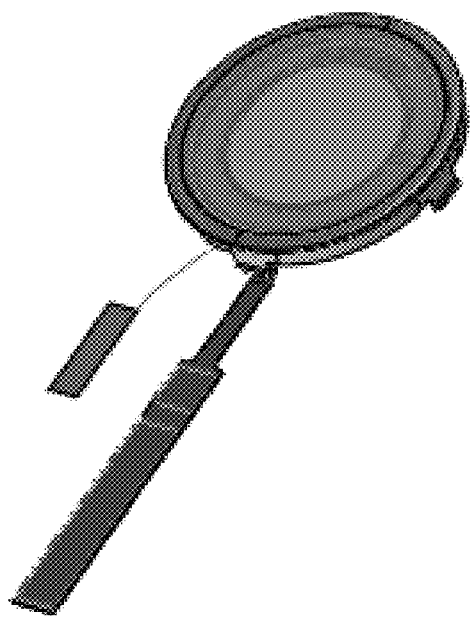
FIG. 21 is an external view of an assembled embodiment of the present disclosure.

FIG. 21 is an external view of an assembled embodiment of the present disclosure.

The display module comprising a touch slide bar as prepared was mounted to a hand-held vacuum cleaner with a fastener. After testing, the display module did not fail after working, the touch slide bar was easy to operate, and the product was small and good-looking.

The display module of the present disclosure may be a small size module having excellent high temperature and vigorous vibration resistant properties, and embodiments comprising the aforementioned technical details also have many excellent technical effects. When the display module is used in a household cleaning appliance, the interaction with the display unit and the control of the cleaning of the cleaning level may be achieved by sliding touch, thereby improving the comfort of use and intelligent degree of the product.

The above descriptions are only particular embodiments of the present disclosure, but the protection scope of the present disclosure is not limited thereto. Within the technical scope disclosed in the present disclosure, one skilled in the art can readily envisage variations and alternatives, and all of them are covered by the protection scope of the present disclosure. Therefore, the protection scope of the present disclosure should be defined by the appended claims.

What is claimed is:

1. A display module comprising: a supporting intermediate frame and a transparent cover plate, wherein the supporting intermediate frame comprises a main plate portion extending in a direction the same as the transparent cover plate and a supporting lateral edge disposed to surround the main plate portion, and the supporting intermediate frame and the transparent cover plate form a first accommodation space; a display unit disposed in the first accommodation space; and a control board disposed at a side of the main plate portion away from the display unit, wherein the control board is electrically connected to the display unit to transmit a display signal to the display unit; wherein the supporting intermediate frame further comprises at least one fixing portion disposed at a side of the main plate portion away from the display unit for fixing the control board; wherein the supporting lateral edge and the main plate portion form a second accommodation space, and at least a part of the control board is disposed in the second accommodation space; and wherein the supporting lateral edge comprises a first sub-supporting lateral edge, which is disposed to surround the control board and forms a lateral barrier for the second accommodation space.

2. The display module according to claim 1, wherein the fixing portion is a supporting fixing pillar comprising a supporting portion at a side close to the main plate portion and a connecting portion at a side away from the main plate portion; wherein the connecting portion comprises a position-limiting portion and a fixing head, and one end of the position-limiting portion is connected to the supporting portion, and the other end of the position-limiting portion is connected to the fixing head; and wherein the control board comprises a position-limiting hole penetrating the control board, the position-limiting portion passes through the position-limiting hole, and the supporting portion and the fixing head are disposed at both sides of the control board respectively and cooperate with the position-limiting portion to fix the control board.

3. The display module according to claim 2, wherein a material for the fixing portion comprises a hot melt material.

4. The display module according to claim 1, wherein the display unit is electrically connected to the control board via a flexible circuit board; and the main plate portion comprises a first through hole, and the flexible circuit board passes through the first through hole; the control board comprises a second through hole, and the flexible circuit board passes through the second through hole and is connected to a side of the control board away from the main plate portion; and the display module further comprises a sealing tape, whose orthographic projection on an extending plane of the control board covers the second through hole.

5. The display module according to claim 4, wherein the control board comprises a second through hole, and the flexible circuit board passes through the second through hole and is connected to a side of the control board away from the main plate portion; the control board comprises a control board body and a flexible circuit board connector disposed at a side of the control board body away from the main plate portion, the flexible circuit board connector is disposed adjacent to the second through hole, and the flexible circuit board connector comprises a flexible circuit board connecting terminal; the second through hole is a strip-shaped through hole, and the flexible circuit board connecting terminal extends in a direction the same as an extending direction of the second through hole; and the second through hole is disposed at an edge of the control board, and the flexible circuit board connector is closer to a center of the control board than the second through hole.

6. The display module according to claim 5, wherein the control board body comprises a first position-limiting hole disposed between the second through hole and a first edge of the control board body; and an orthographic projection of a center of the first position-limiting hole on a hole edge of the second through hole close to the first position-limiting hole is located within a middle ⅓ section of an entire length of the hole edge; and the fixing portion comprises a first sub-fixing portion cooperating with the first position-limiting hole for fixing.

7. The display module according to claim 6, wherein the control board comprises a touch unit connector disposed at a side of the control board body away from the main plate portion; and when a circle is drawn with a center of the control board body as an origin on a plane in which the touch unit connector is located, and the circle has an area covering ⅑ of an area of the control board, an orthographic projection of the touch unit connector on the control board body has a center inside the circle.

8. The display module according to claim 7, wherein the touch unit connector comprises a touch unit connecting terminal which is configured to allow a touch unit connecting cable to extend in a direction away from the flexible circuit board connector.

9. The display module according to claim 8, wherein the display module comprises a touch unit connected to the touch unit connecting terminal via the touch unit connecting cable;
the control board body comprises a second position-limiting hole which is disposed adjacent to a second edge of the control board, wherein the second edge is located opposite to the first edge; the second position-limiting hole is disposed adjacent to the touch unit connecting cable; an orthographic projection of the touch unit connecting cable on the control board does not overlap with the second position-limiting hole; and
the fixing portion comprises a second sub-fixing portion cooperating with the second position-limiting hole for fixing.

10. The display module according to claim 9, wherein the control board comprises a power input connector disposed at a side of the control board body away from the main plate portion; the power input connector is located at one side of a surface of the control board body divided by an orthographic projection of an axis of the touch unit connecting cable on the surface of the control board body; and the power input connector comprises a power input connecting terminal which is configured such that a power connecting cable extends towards an edge of the control board body in a direction at an angle other than 0° and 180° with respect to an extending direction of the touch unit connecting cable.

11. The display module according to claim 10, wherein the control board comprises a speaker connector disposed at a side of the control board body away from the main plate portion; wherein the speaker connector is located at the other side of the surface of the control board body divided by the orthographic projection of the axis of the touch unit connecting cable on the surface of the control board body, other than the side at which the power input connector is located; and the speaker connector comprises a speaker connecting terminal which is configured such that the speaker connecting cable extends towards the edge of the control board body in a direction at an angle other than 0° and 180° with respect to the extending direction of the touch unit connecting cable.

12. The display module according to claim 11, wherein the power input connecting terminal and the speaker connecting terminal are configured such that a power input connecting cable and a speaker connecting cable extend in opposite directions; and the power input connecting terminal is configured such that the power input connecting cable has an extending direction perpendicular to that of the touch unit connecting cable.

13. The display module according to claim 7, wherein the control board body further comprises a third position-limiting hole disposed between the flexible circuit board connector and the touch unit connector; wherein the third position-limiting hole does not intersect a connecting line passing through a center of an orthographic projection of the touch unit connector on the control board body and a center of an orthographic projection of the flexible circuit board on the control board body; and the fixing portion comprises a third sub-fixing portion cooperating with the third position-limiting hole for fixing.

14. The display module according to claim 13, wherein the control board body comprises a fourth position-limiting hole and fifth position-limiting hole, both of which are disposed close to edges of the control board body; wherein the fourth position-limiting hole is located on a connecting line traveling clockwise from the first position-limiting hole to the second position-limiting hole along the edges of the control board body; and the fifth position-limiting hole is located on a connecting line traveling counterclockwise from the first position-limiting hole to the second position-limiting hole along the edges of the control board body; and wherein: the fourth position-limiting hole and the fifth position-limiting hole are configured such that when drawing connecting lines from the first, second, fourth and fifth position-limiting holes to a center of the control board, an angle formed between each two connecting lines is greater than or equal to 45°; the fixing portion comprises a fourth sub-fixing portion cooperating with the fourth position-limiting hole for fixing; the fixing portion comprises a fifth sub-fixing portion cooperating with the fifth position-limiting hole for fixing; the control board body comprises a sixth position-limiting hole, wherein the sixth position-limiting hole and the third position-limiting hole are respectively located at two sides of the straight line in which the connecting line passes through the center of the orthographic projection of the touch unit connector on the control board body and the center of the orthographic projection of the flexible circuit board on the control board body; a minimum distance between the sixth position-limiting hole and an edge of the control board body is greater than a minimum distance between any one of the first, second, fourth and fifth position-limiting holes and an edge of the control board body; and the fixing portion comprises a sixth sub-fixing portion cooperating with the sixth position-limiting hole for fixing.

15. The display module according to claim 7, wherein the control board comprises a processing unit disposed at a side of the control board body away from the main plate portion.

16. The display module according to claim 1, wherein a gap between the control board and the first sub-supporting lateral edge is filled with a sealing adhesive.

17. The display module according to claim 16, wherein the transparent cover plate is fixed to a side of the supporting lateral edge close to the transparent cover plate; and the first accommodation space and the second accommodation space as a whole form a sealed space.

18. The display module according to claim 1, wherein the supporting lateral edge comprises a second sub-supporting lateral edge and a third sub-supporting lateral edge disposed in parallel, wherein the second sub-supporting lateral edge is closer to the display unit than the third sub-supporting lateral edge, and the second sub-supporting lateral edge is directly connected to the main plate portion; and the control board comprises an indicator lamp disposed at a side of the control board close to the transparent cover plate; and there is a gap between the second sub-supporting lateral edge and the third sub-supporting lateral edge, and when the indicator lamp is operating, light emitted by the indicator lamp is able to travel towards the transparent cover plate through the gap, and be transmitted through the transparent cover plate outwards.

19. The display module according to claim 18, wherein the transparent cover plate comprises a cover plate body and a light filtering layer disposed at a side of the cover plate body close to the display unit; the light filtering layer comprises a transparent region and a light shielding region disposed to surround the transparent region, and the transparent region is used for transmission of light emitted by the display unit; and the light filtering layer further comprises a translucent region, which is used for transmission of light emitted by the indicator lamp when the indicator lamp is operating and presents a color the same as or close to that of the light shielding region when the indicator lamp is not operating.

20. The display module according to claim 19, wherein the supporting lateral edge comprises a plurality of fourth sub-supporting lateral edges which connect the second sub-supporting lateral edge with the third sub-supporting lateral edge; the fourth sub-supporting lateral edges extend in directions parallel to an extending surface of the control board; and the fourth sub-supporting lateral edges are disposed close to the control board.

* * * * *